(12) United States Patent
Kawamura et al.

(10) Patent No.: US 9,201,303 B2
(45) Date of Patent: Dec. 1, 2015

(54) PHOTORESIST COMPOSITION

(71) Applicant: SUMITOMO CHEMICAL COMPANY, LIMITED, Tokyo (JP)

(72) Inventors: Maki Kawamura, Osaka (JP); Junji Nakanishi, Osaka (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 13/910,638

(22) Filed: Jun. 5, 2013

(65) Prior Publication Data

US 2013/0330669 A1 Dec. 12, 2013

(30) Foreign Application Priority Data

Jun. 8, 2012 (JP) .................. 2012-130520

(51) Int. Cl.
*G03F 7/039* (2006.01)
*G03F 7/20* (2006.01)
*G03F 7/004* (2006.01)

(52) U.S. Cl.
CPC ............ *G03F 7/0392* (2013.01); *G03F 7/0045* (2013.01); *G03F 7/20* (2013.01); *Y10S 430/113* (2013.01)

(58) Field of Classification Search
CPC ..................... Y10S 430/13; Y10S 430/113
See application file for complete search history.

(56) References Cited

U.S. PATENT DOCUMENTS

| | | | | |
|---|---|---|---|---|
| 5,077,174 A * | 12/1991 | Bauer et al. | ................. | 430/270.1 |
| 5,236,812 A * | 8/1993 | Vassiliou et al. | ............... | 430/327 |
| 5,846,690 A | 12/1998 | Padmanaban et al. | | |
| 2002/0164540 A1 * | 11/2002 | Nakanishi et al. | ......... | 430/270.1 |
| 2007/0015080 A1 * | 1/2007 | Toukhy et al. | ............. | 430/270.1 |
| 2008/0153036 A1 | 6/2008 | Suetsugu et al. | | |
| 2009/0130568 A1 * | 5/2009 | Tomari et al. | ..................... | 430/2 |

FOREIGN PATENT DOCUMENTS

| | | |
|---|---|---|
| JP | 2008-46594 A | 2/2008 |
| JP | 2008-134515 A | 6/2008 |
| JP | 2008-249993 A | 10/2008 |
| WO | WO 97/05172 A1 * | 2/1997 |

* cited by examiner

*Primary Examiner* — Cynthia Hamilton

(74) *Attorney, Agent, or Firm* — Birch, Stewart, Kolasch & Birch, LLP

(57) ABSTRACT

A photoresist composition comprising:
a resin which shows an increase in solubility in an aqueous alkali solution by an action of an acid;
an acid generator;
a plasticizer; and
a solvent the amount of which is from 40 to 75% by mass of the total amount of the photoresist composition.

6 Claims, 1 Drawing Sheet

(a)      (b)      (c)

(d)      (e)

PHOTORESIST COMPOSITION

This nonprovisional application claims priority under 35 U.S.C. §119 (a) on Patent Application No. 2012-130520 filed in JAPAN on Jun. 8, 2012, the entire contents of which are hereby incorporated by reference.

FIELD OF THE INVENTION

The present invention relates to a photoresist composition and a method for producing a photoresist pattern.

BACKGROUND OF THE INVENTION

The electrodes which is a bump with height 4 to 150 μm are aligned on a substrate in a process of mounting pins by a thin film for semiconductor chips.

As to photoresist compositions for producing a bump, JP2008-134515A1 mentions a positive type chemically amplified photoresist composition which optionally comprises an amine compound as a quencher.

SUMMARY OF THE INVENTION

The present application provides the inventions as follow.
[1] A photoresist composition comprising:
  a resin which shows an increase in solubility in an aqueous alkali solution by an action of an acid;
  an acid generator;
  a plasticizer; and
  a solvent the amount of which is from 40 to 75% by mass of the total amount of the photoresist composition.
[2] The photoresist composition according to [1], wherein the resin is a resin obtained by reacting a novolak resin,
a compound having two or more vinyloxy groups and
a resin comprising a structural unit represented by formula (a1-2), a structural unit represented by formula (a2-1), or both of the structural units:

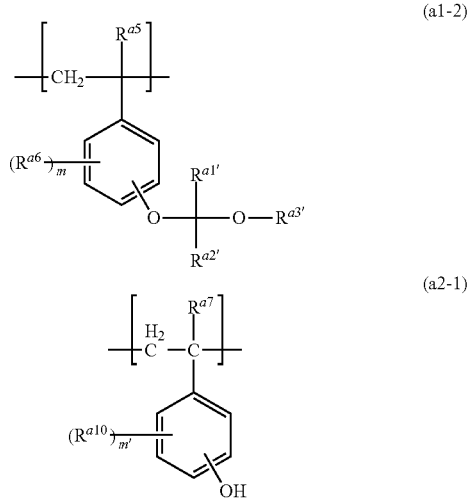

wherein $R^{a1'}$ and $R^{a2'}$ each independently represent a hydrogen atom or a C1-C12 hydrocarbon group where a methylene group has optionally been replaced by an oxygen atom or a sulfur atom, $R^{a3'}$ represents a C1-C20 hydrocarbon group where a methylene group has optionally been replaced by an oxygen atom or a sulfur atom, or one of $R^{a1'}$ and $R^{a2'}$ is bonded to $R^{a3'}$ to form a C2-C20 divalent hydrocarbon group where a methylene group has optionally been replaced by an oxygen atom or a sulfur atom, and the other represents a hydrogen atom or a C1-C12 hydrocarbon group where a methylene group has optionally been replaced by an oxygen atom or a sulfur atom, $R^{a5}$ represents a hydrogen atom or a methyl group,
$R^{a6}$ represents a C1-C6 alkyl group or a C1-C6 alkoxy group, and m represents an integer of 0 to 4,
$R^{a7}$ represents a hydrogen atom or a methyl group,
$R^{a10}$ represents a C1-C6 alkyl group or a C1-C6 alkoxy group, and
m' represents an integer of 0 to 4.
[3] The photoresist composition according to [1] or [2], which further comprises a novolak resin.
[4] The photoresist composition according to any one of [1] to [3], wherein the acid generator is a compound represented by formula (b5):

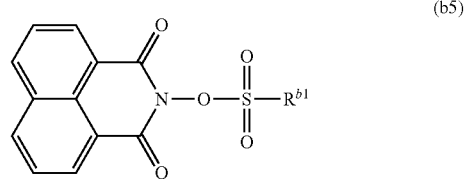

where $R^{b1}$ represents a C1-C18 hydrocarbon group in which a hydrogen atom has optionally been replaced by a fluorine atom and in which a methylene group has optionally been replaced by an oxygen atom or a carbonyl group.
[5] The photoresist composition according to any one of [1] to [4], wherein the plasticizer is one selected from the group consisting of phthalates, aliphatic hydrocarbon carboxylates and aromatic sulfonamides.
[6] A method for producing a photoresist film with thickness 3 μm to 150 μm, which comprises applying the photoresist composition according to any one of [1] to [5] to a substrate.
[7] A photoresist film with thickness 3 μm to 150 μm, which is obtained by applying the photoresist composition according to any one of [1] to [5] to a substrate.
[8] A process for producing a photoresist pattern comprising:
  (1) a step of applying the photoresist composition according to any one of [1] to [6] on a substrate,
  (2) a step of forming a photoresist composition film by drying the photoresist composition,
  (3) a step of exposing the photoresist composition film, and
  (4) a step of developing the exposed photoresist composition film.

The photoresist composition of the present invention can provide a photoresist film showing excellent resistance to heat and hardly cracking.

DESCRIPTION OF THE PREFERRED INVENTION

Figure 1:
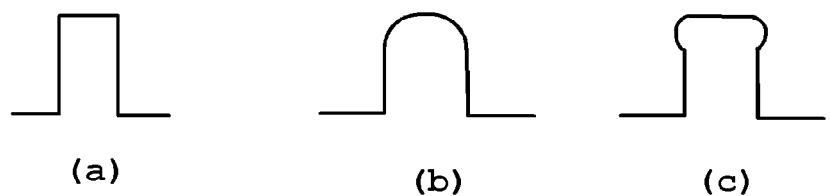
FIGS. 1(a), 1(b) and 1(c) illustrate a schematic cross-sectional view of photoresist film having line and space pattern, prepared in Examples 1 to 15 and Comparative example 1.

The photoresist composition of the present invention comprises:
- a resin which shows an increase in solubility in an aqueous alkali solution by an action of an acid;
- an acid generator;
- a plasticizer; and
- a solvent.

The photoresist composition comprises a resin which shows increase in solubility in an aqueous alkali solution by an action of an acid, which resin is sometimes referred to as "resin (A)". The photoresist composition may comprise another resin than the resin (A).

Herein, "increase in solubility in an aqueous alkali solution by an action of an acid" means that the solubility of resin becomes increased by contacting it with an acid, for example that the resin is insoluble or poorly soluble in an alkali aqueous solution before contacting it with an acid but becomes soluble in an alkali aqueous solution after that.

The resin (A) preferably comprises a structural unit having an acid-labile group. Hereinafter the structural unit is sometimes referred to as "structural unit (a1)".

Herein, "an acid-labile group" means a group capable of being eliminated by the action of an acid to form a hydrophilic group such as a hydroxyl group or carboxy group.

Examples of the acid-labile group include a group represented by the formula (1) or the formula (2):

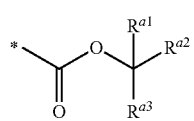

(1)

wherein $R^{a1}$, $R^{a2}$ and $R^{a3}$ independently each represent a C1-C8 alkyl group or a C3-C20 alicyclic hydrocarbon group, or
two of $R^{a1}$, $R^{a2}$ and $R^{a3}$ are bonded each other to form a C2-C20 divalent hydrocarbon group and the other is a C1-C8 alkyl group or a C3-C20 alicyclic hydrocarbon group, and * represents a binding position.

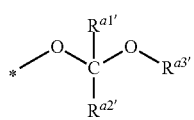

(2)

wherein $R^{a1'}$ and $R^{a2'}$ independently each represent a hydrogen atom or a C1-C12 hydrocarbon group where a methylene group has optionally been replaced by an oxygen atom or a sulfur atom, and $R^{a3'}$ represents a C1-C20 hydrocarbon group where a methylene group has optionally been replaced by an oxygen atom or a sulfur atom,
or one of $R^{a1'}$ and $R^{a2'}$ represents a hydrogen atom or a C1-C12 hydrocarbon group where a methylene group has optionally been replaced by an oxygen atom or a sulfur atom, and the other is bonded to $R^{a3'}$ to form a C2-C20 divalent hydrocarbon group where a methylene group has optionally been replaced by an oxygen atom or a sulfur atom, and * represents a binding position.

Specific examples of the C1-C8 alkyl group represented by $R^{a1}$, $R^{a2}$ and $R^{a3}$ include a methyl group, an ethyl group, a propyl group, an isopropyl group, a butyl group, a pentyl group, a hexyl group, a heptyl group and an octyl group.

The alicyclic hydrocarbon group represented by $R^{a1}$, $R^{a2}$ and $R^{a3}$ may be monocyclic or polycyclic. Examples of the alicyclic hydrocarbon group include a monocyclic alicyclic hydrocarbon group such as a C3-C20 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group such as a decahydronaphthyl group, an adamantyl group, a norbornyl group, and the followings:

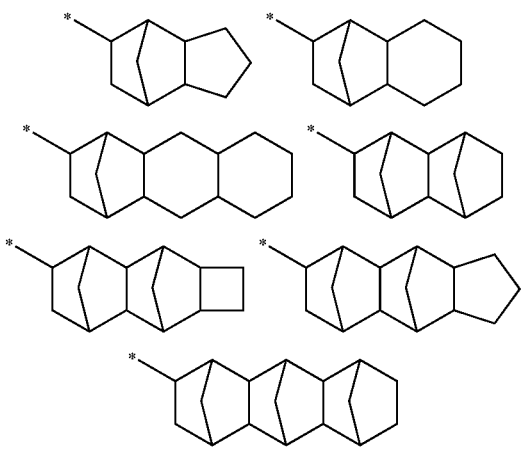

wherein * represents a binding position.

The alicyclic hydrocarbon group preferably has 3 to 16 carbon atoms.

When two of $R^{a1}$, $R^{a2}$ and $R^{a3}$ are bonded to each other to form the divalent hydrocarbon group, examples of the group represented by —C($R^{a1}$)($R^{a2}$)($R^{a3}$) include the following groups and the divalent hydrocarbon group preferably has 3 to 12 carbon atoms.

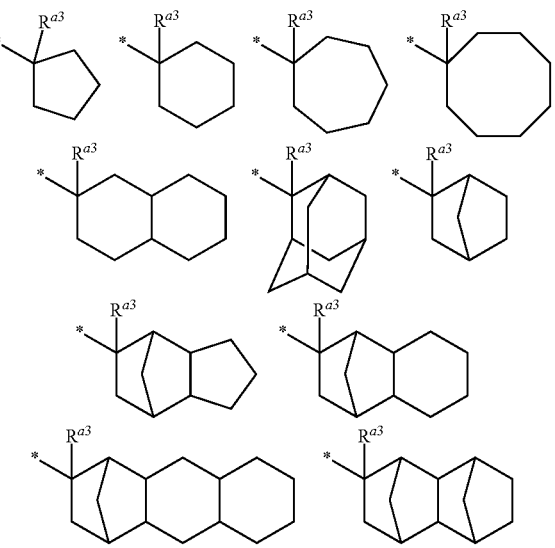

-continued

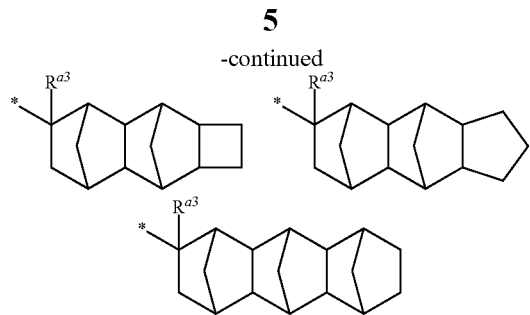

wherein $R^{a3}$ is the same as defined above, and * represents a binding position.

As the group represented by the formula (1), preferable are 1,1-dialkylalkoxycarbonyl group, i.e. the group represented by the formula (1) wherein $R^{a1}$, $R^{a2}$ and $R^{a3}$ independently each represent a C1-C8 alkyl group, preferably a tert-butyl group; a 2-alkyladamantane-2-ylxoycarbonyl group, i.e., the group represented by the formula (1) wherein $R^{a1}$ and $R^{a2}$ are bonded each other to form an adamantyl ring and $R^{a3}$ is a C1-C8 alkyl group; and 1-(adaman-1-tyl)-1-alkylalkoxycarbonyl group, i.e., the group represented by the formula (1) wherein $R^{a1}$ and $R^{a2}$ are C1-C8 alkyl groups and $R^{a3}$ is an adamantyl group.

Examples of the hydrocarbon group represented by $R^{a1'}$, $R^{a2'}$ and $R^{a3'}$ include an aliphatic hydrocarbon group, an alicyclic hydrocarbon group, an aromatic hydrocarbon group and a combined structure of them.

Examples of the aliphatic hydrocarbon group include the alkyl group as mentioned above. Examples of the alicyclic hydrocarbon group include the same as described above.

Examples of the aromatic hydrocarbon group include an aryl group such as a phenyl group, a naphthyl group, a p-methylphenyl group, a p-tert-butylphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group.

The group formed by combining an aliphatic hydrocarbon group and an alicyclic hydrocarbon group includes methylcyclohexyl group, dimethylcyclohexyl group, methylnorbornyl group, isobornyl group and 2-alkyladamantane-2-yl group, a 1-(adamantane-1-yl) alkane-1-yl group.

The group formed by combining an aliphatic hydrocarbon group and an aromatic hydrocarbon group includes an aralkyl group, specifically benzyl group, a phenethyl group, a phenylpropyl group, a trityl group, naphthylmethyl group and naphthylethyl group.

When $R^{a3'}$ and one of $R^{a1'}$ and $R^{a2'}$ are bonded to each other to form a divalent hydrocarbon group, examples of the group represented by —C($R^{a1'}$)($R^{a2'}$)(O$R^{a3'}$) include the following groups and the divalent hydrocarbon group preferably has 3 to 12 carbon atoms.

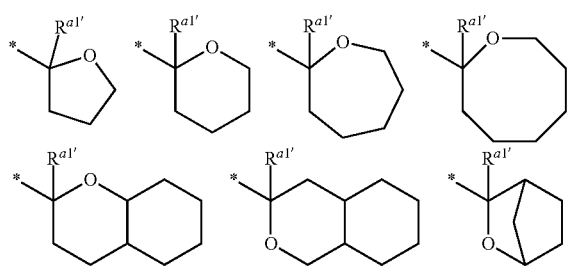

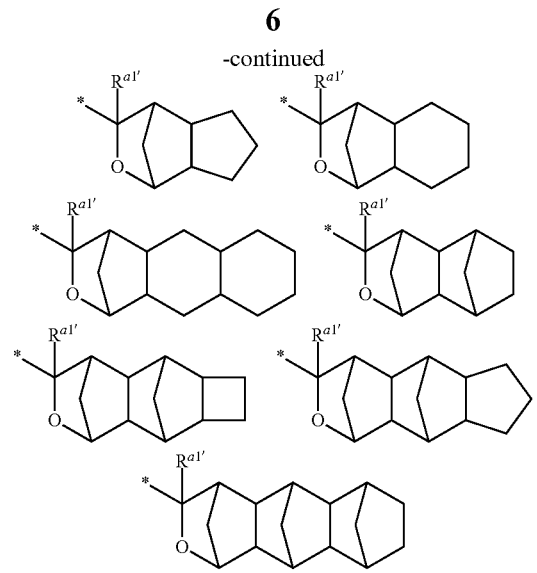

It is preferred that at least one of $R^{a1'}$ and $R^{a2'}$ is a hydrogen atom.

Examples of the group represented by the formula (2) include the following.

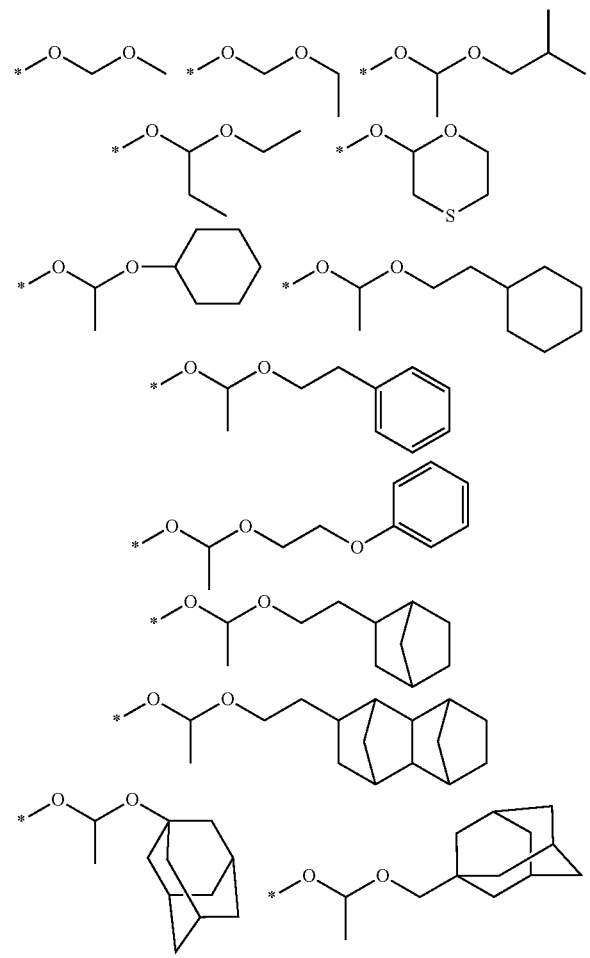

wherein * represents a binding position.

The monomer from which the structural unit (a1) is derived is preferably a monomer having an acid-labile group in its side chain and a carbon-carbon double bond, and is more preferably an acrylate or methacrylate monomer having the group represented by formula (1) in its side chain and a an acrylate or methacrylate monomer having the group represented by formula (2), and still more preferably an acrylate or a methacrylate monomer having the group represented by the formula (1) in its side chain. The resin (A) may comprise one or more structural units (a1). Preferable examples of the structural units (a1) include the structural units represented by the formulae (a1-1) and (a1-2):

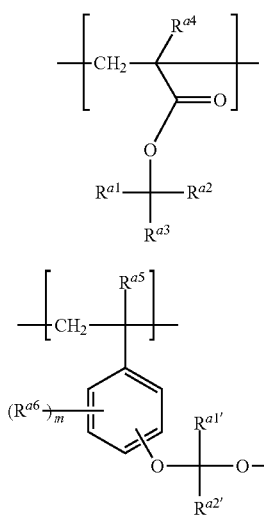

(a1-1)

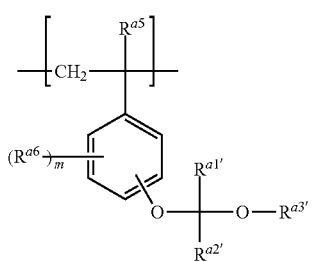

(a1-2)

In each formula, $R^{a1}$, $R^{a2}$, $R^{a3}$, $R^{a1'}$, $R^{a2'}$ and $R^{a3'}$ are the same meanings as above, $R^{a4}$ and $R^{a5}$ each independently represent a hydrogen atom or a methyl group, $R^{a6}$ represents a C1-C8 alkyl group or a C1-C8 alkoxy group, and m represents an integer of 0 to 4.

In formula (a1-1), preferably each of $R^{a1}$, $R^{a2}$ and $R^{a3}$ is a C1-C8 alkyl group, or two of $R^{a1}$, $R^{a2}$ and $R^{a3}$ are bonded to each other to represent C2-C20 hydrocarbon group and the other represents a C1-C8 alkyl group.

$R^{a2'}$ is preferably a C1-C12 hydrocarbon group, more preferably a C1-C12 alkyl group, and still more preferably a methyl group and an ethyl group.

In formula (a1-2), $R^{a1'}$ is preferably a hydrogen atom.

$R^{a2'}$ is preferably a C1-C12 hydrocarbon group, more preferably a C1-C12 alkyl group, and still more preferably a methyl group and an ethyl group.

The hydrocarbon group represented by $R^{a3'}$ includes preferably a C1-C18 alkyl group, a C3-C18 alicyclic hydrocarbon group, a C6-C18 aromatic hydrocarbon group, and a combined group of them, more preferably a C1-C18 alkyl group, a C3-C18 alicyclic hydrocarbon group, and C7-C18 aralkyl group. The alkyl group and the alicyclic hydrocarbon group are preferably unsubstituted. When the aromatic hydrocarbon group has been substituted, the substituent is a C6-C10 aryloxy group.

$R^{a5}$ is preferably a hydrogen atom.

$R^{a6}$ is preferably a C1-C4 alkoxy group, and more preferably a methoxy and ethoxy group, and still more preferably methoxy group.

m is preferably 0 or 1, and more preferably 0.

Examples of the structural unit represented by formula (a1-1) include one represented by formulae (a1-1-1) to (a1-1-17).

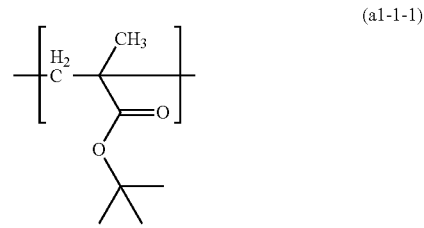

(a1-1-1)

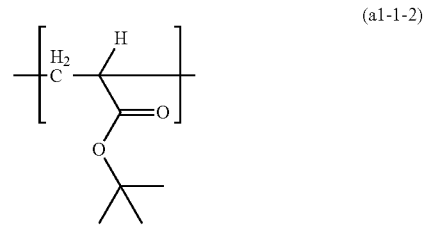

(a1-1-2)

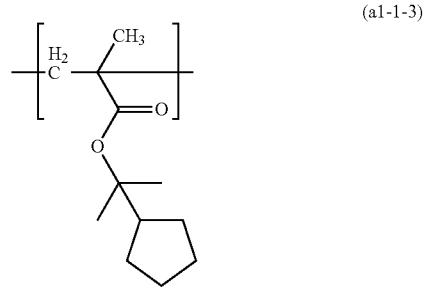

(a1-1-3)

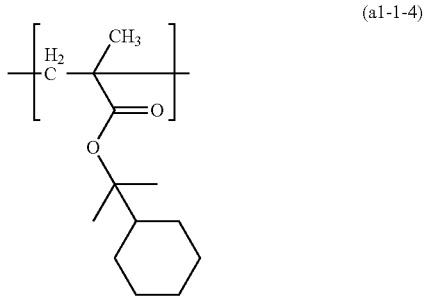

(a1-1-4)

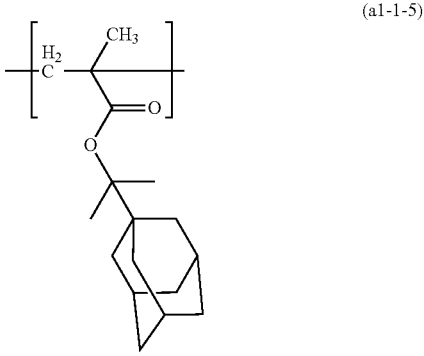

(a1-1-5)

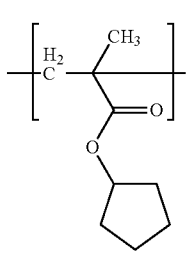 (a1-1-6)
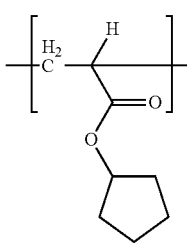 (a1-1-7)
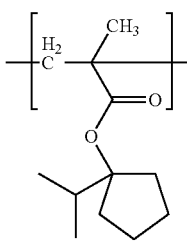 (a1-1-8)
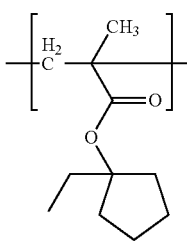 (a1-1-9)
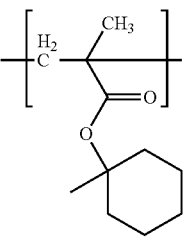 (a1-1-10)
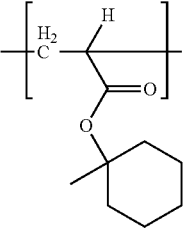 (a1-1-11)
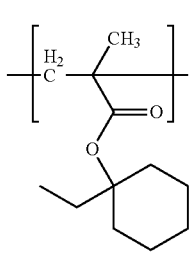 (a1-1-12)
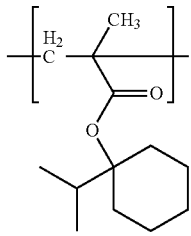 (a1-1-13)
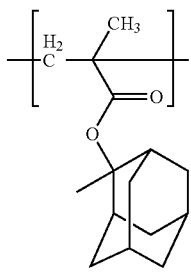 (a1-1-14)
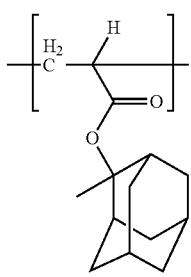 (a1-1-15)
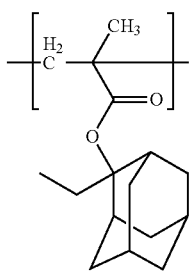 (a1-1-16)
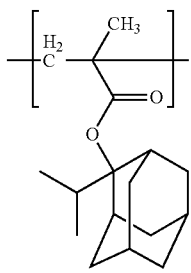 (a1-1-17)

Examples of the structural unit represented by formula (a1-2) include one derived from the monomer represented by any one of formulae (a1-2-1) to (a1-2-8).

(a1-2-1)
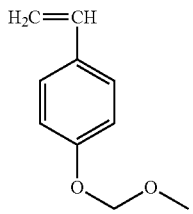

(a1-2-2)
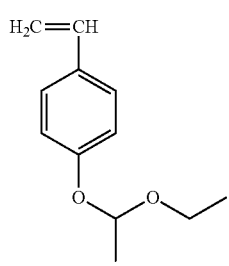

(a1-2-3)
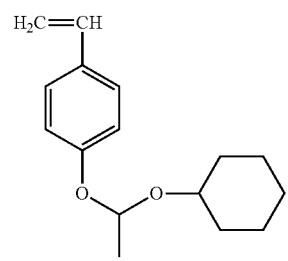

(a1-2-4)
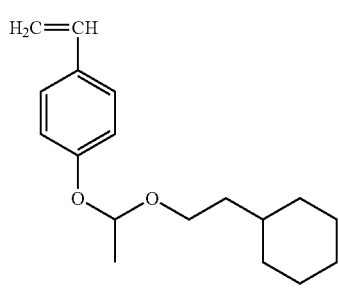

(a1-2-5)
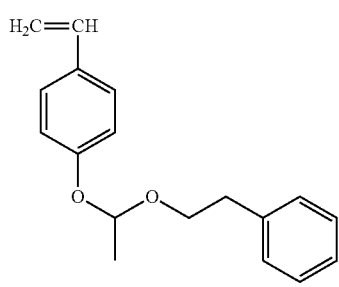

(a1-2-6)
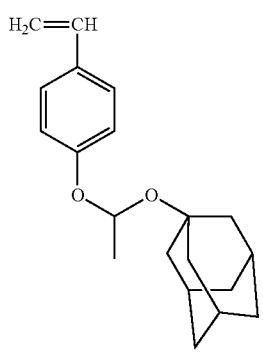

(a1-2-7)
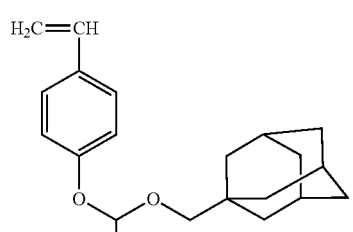

(a1-2-8)
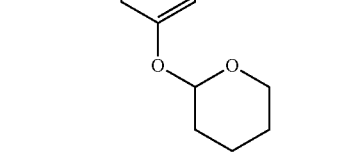
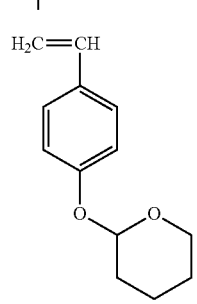

When the resin comprises the structural unit represented by formula (a1-1) and/or formula (a1-2), the total content of these structural units is usually 10 to 95% by mole and preferably 15 to 90% by mole, more preferably 25 to 85% by mole, and still more preferably 20 to 60% by mole based on total molar of all the structural units of the resin.

The resin preferably may comprise a structural unit having no acid-labile group, in addition to the structural unit having an acid-labile group. The resin can have two or more kinds of structural units having no acid-labile group. The structural unit having no acid-labile group preferably comprises a hydroxyl group or a lactone ring. When the resin comprises the structural unit having no acid-labile group, the content ratio of the structural unit having an acid-labile group to the structural unit having no acid-labile group, i.e., [the structural unit having an acid-labile group]:[the structural unit having no acid-labile group] is preferably 10:90 to 80:20, more preferably 20:80 to 60:40, on the molar base.

Examples of the structural unit represented by formula (a2) include one represented by formulae (a2-1), (a2-2) and (a2-3).

(a2-1)
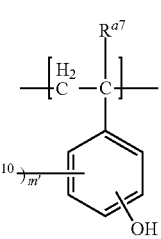

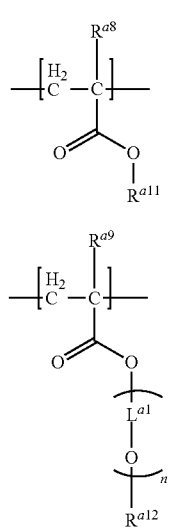

(a2-2)

(a2-3)

wherein $R^{a7}$, $R^{a8}$ and $R^{a9}$ independently represent a hydrogen atom or a methyl group, $R^{a10}$ represents a C1-C6 alkyl group or a C1-C6 alkoxy group, m' represents an integer of 0 to 4, $R^{a11}$ represents a C1-C10 monovalent or divalent hydrocarbon group, $R^{a12}$ represents a C1-C6 alkyl group, $L^{a1}$ represents a C1-C6 monovalent or divalent alkanediyl group, and n' represents an integer of 1 to 30.

Examples of the alkyl group in formulae (a2-1), (a2-2) and (a2-3) include a methyl group, an ethyl group, a propyl group, a butyl group, a pentyl group and a hexyl group.

Examples of the alkoxy group include a methoxy group, an ethoxy group, a propoxy group, a butoxy group, a pentyloxy group and a hexyloxy group.

Examples of the alkanediyl group include linear alkanediyl groups such as methylene group, ethylene group, propane-1,3-diyl group, butane-1,4-diyl group, pentane-1,5-diyl group, and hexane-1,6-diyl group; and branched alkanediyl groups such as a propane-1,2-diyl group, a pentane-1,4-diyl group, and a 2-methylbutane-1,4-diyl group. The hydrocarbon group represented by $R^{a11}$ includes a methyl group, an ethyl group, a propyl group, a butyl group, a pentyl group, a hexyl group, a heptyl group, and an octyl group. The alicyclic hydrocarbon group includes a C3-C10 cycloalkyl group such as a cyclohexyl group, a cycloheptyl group, or an adamantyl group.

The aromatic hydrocarbon group includes a phenyl group or a naphtyl group.

$R^{a7}$ preferably represents a hydrogen atom.

$R^{a10}$ represents preferably a C1-C4 alkoxy group, more preferably a methoxy group or an ethoxy group, and still more preferably a methoxy group.

m' represents preferably an integer of 0 or 1, more preferably an integer of 0.

$R^{a11}$ represents preferably a C1-C6 monovalent or divalent alkyl group, a C5-C10 alicyclic hydrocarbon group and a C6-C10 aromatic hydrocarbon group.

$L^{a1}$ represents preferably an ethane-1,2-diyl group, a propane-1,3-diyl group and a butane-1,2-diyl group, more preferably an ethane-1,2-diyl group.

n represents preferably an integer of 1 to 10.

Examples of the structural unit represented by formula (a2-1) include those represented by formulae (a2-1-1), (a2-1-2), (a2-1-3) and (a2-1-4). The monomers from which the structural units represented by formula (a2-1) are derived are mentioned in JP2010-204634A1.

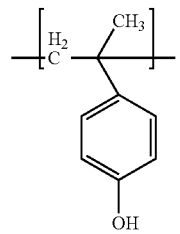

(a2-1-1)

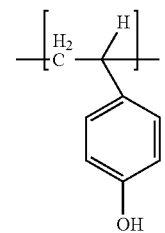

(a2-1-2)

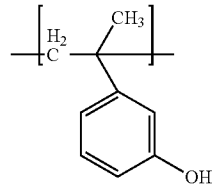

(a2-1-3)

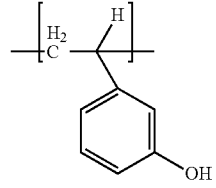

(a2-1-4)

Examples of the monomers from which the structural units represented by formula (a2-2) are derived include alkyl (meth)acrylates such as methyl(meth)acrylate, ethyl(meth)acrylate, propyl(meth)acrylate, butyl(meth)acrylate, hexyl (meth)acrylate, cycloalkyl(meth)acrylates such as cyclopentyl(meth)acrylate and cyclohexyl(meth)acrylate, polycyclic(meth)acrylates such as adamantyl(meth)acrylate, and aryl(meth)acrylates such as phenyl(meth)acrylate and benzyl(meth)acrylate.

Herein, "(meth)acrylate" includes acrylate and methacrylate. Examples of the monomers from which the structural units represented by formula (a2-3) are derived include (meth)acrylates
such as ethyleneglycolmonomethylether(meth)acrylate, ethyleneglycolmonoethylether (meth)acrylate, ethyleneglycolmonopropylethylether (meth)acrylate, ethyleneglycolmonobuthylether (meth)acrylate, diethyleneglycolmonomethylether (meth)acrylate, triethyleneglycolmonomethylether (meth)acrylate, tetraethyleneglycolmonomethylether (meth)acrylate, pentaethyleneglycolmonomethylether (meth)acrylate, hexaethyleneglycolmonomethylether (meth)acrylate, nonaethyleneglycolmonomethylether (meth)acrylate, and octaethyleneglycolmonomethylether (meth)acrylate.

Examples of the monomers from which the structural unit represented by formula (a2) is derived include acrylate, methacrylate, crotonic acid, 2-hydroxyethyl(meta)acrylate, 2-hydroxypropyl(meta)acrylate, styrene, α-methylstyrene, 4-methylstyrene, 2-methylstyrene, 3-methylstyrene, 4-methoxystyrene, and 4-isopropoxystyrene.

Examples of resin (A) include what comprises the combinations of structural units, as represented by the following formulae (A1-1) to (A1-19).

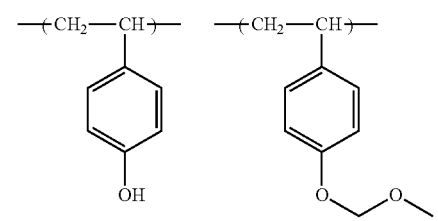
(A1-1)

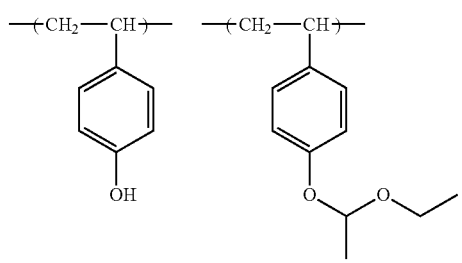
(A1-2)

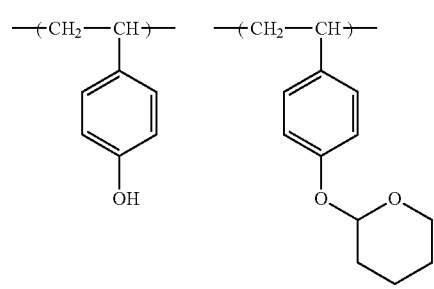
(A1-3)

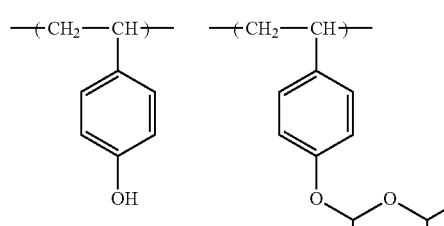
(A1-4)

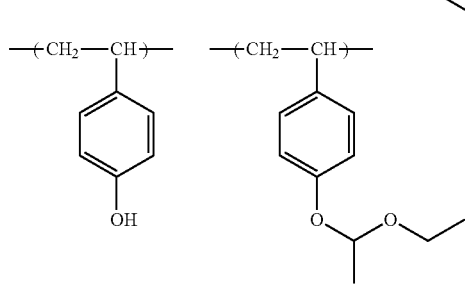
(A1-5)

-continued

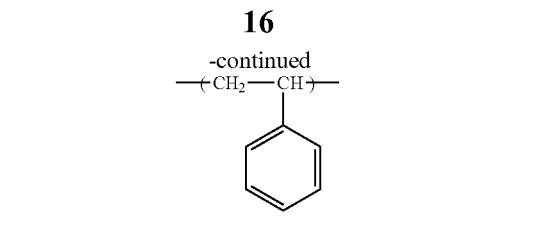
(A1-6)

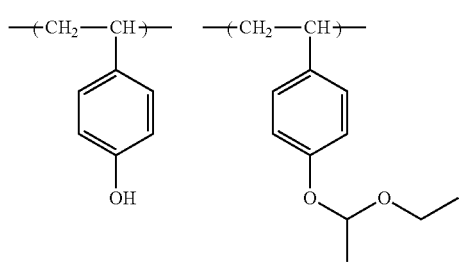

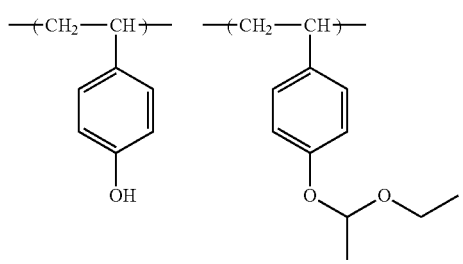
(A1-7)

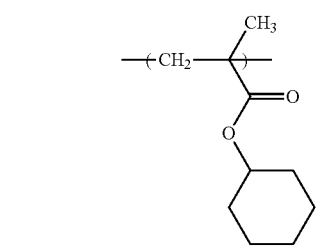

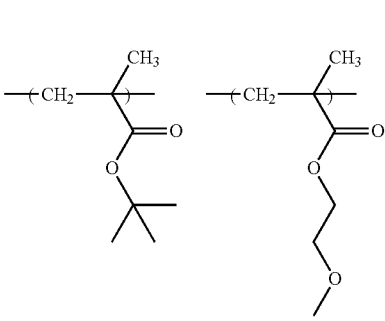
(A1-8)

(A1-9)
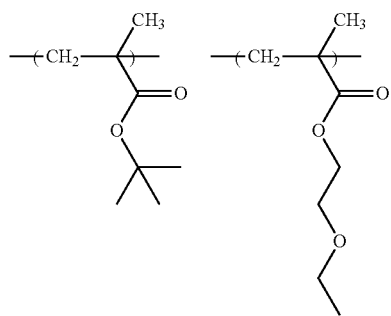
(A1-10)
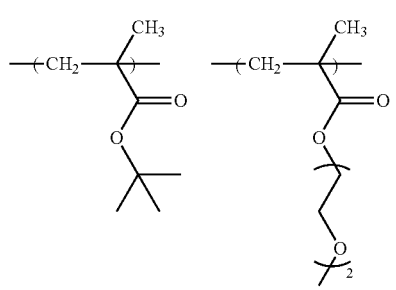
(A1-11)
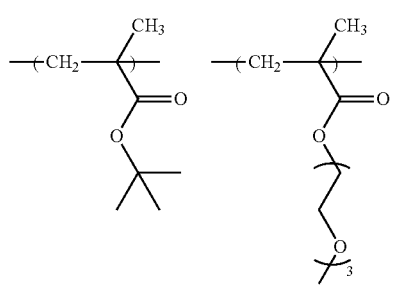
(A1-12)
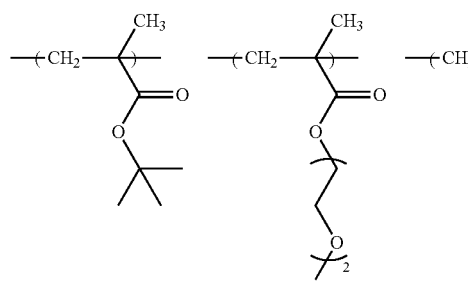
(A1-13)
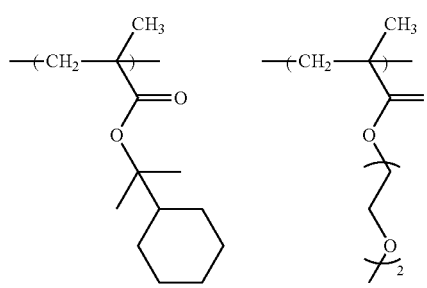
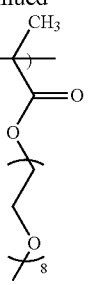
(A1-14)
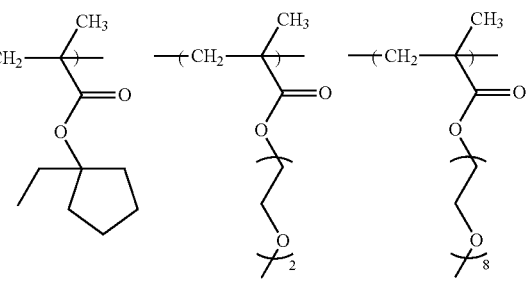
(A1-15)
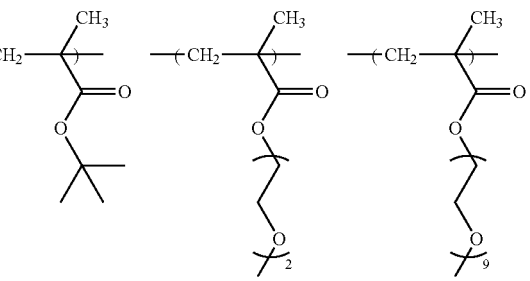
(A1-16)
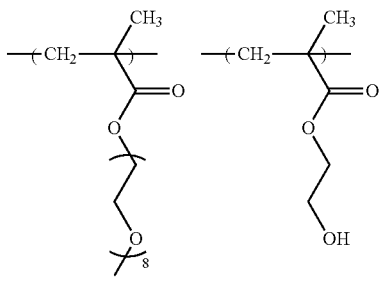
(A1-17)
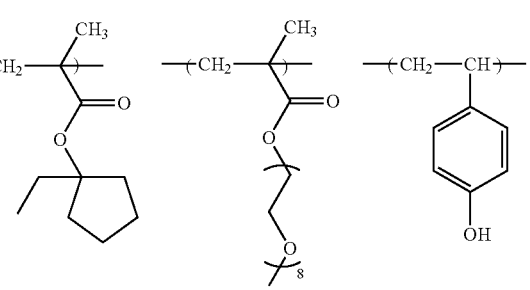

-continued

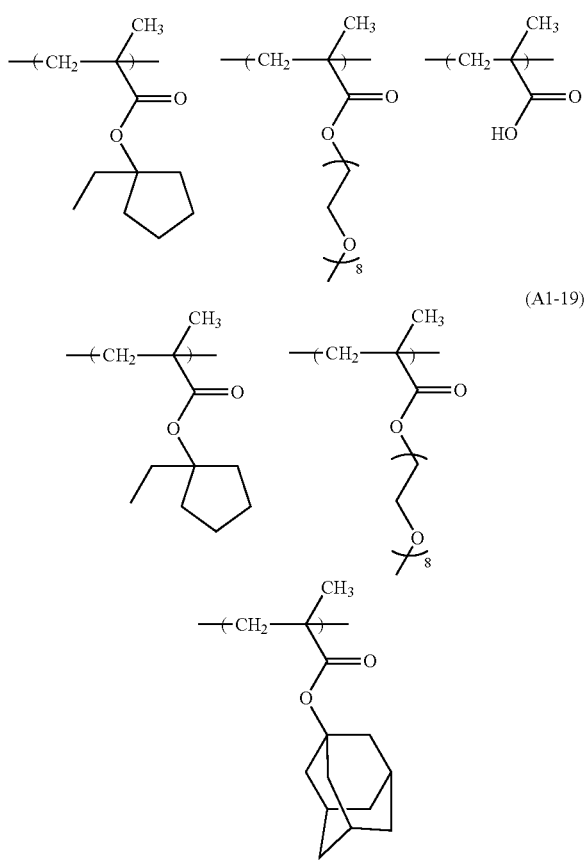

The resin (A) preferably comprises the structural unit represented by formula (a1) and the structural unit represented by formula (a2), more preferably the structural unit represented by formula (a1-1) and/or formula (a1-2) as well as the structural unit represented by formula (a2).

The resin (A) can generally be produced by polymerizing the above-mentioned monomers in a known manner such as radical polymerization.

The average weight molecule weight of the resin (A) is preferably 10000 or more, more preferably 15000 or more, and 600000 or less, more preferably 500000 or less.

Herein, the weight-average molecular weight can be determined by gel permeation chromatography using standard polystyrene as a standard reference material. The detailed condition for the chromatography is described in Examples of the present application.

Another preferred example of the resin (A) includes a resin obtained by reacting
a novolak resin,
a compound having two or more vinyloxy groups, which is sometimes referred to as "vinyl ether compound" and
a resin comprising a structural unit represented by formula (a1-2), a structural unit represented by formula (a2-1), or both of the structural units.

The novolak resin is a resin obtained by condensing a phenol compound with an aldehyde in the presence of a catalyst.

Examples of the phenolic compound include phenol, o-, m- or p-cresol, 2,3-, 2,5-, 3,4- or 3,5-xylenol, 2,3,5-trimethylphenol, 2-, 3- or 4-tert-butylphenol, 2-tert-butyl-4- or 5-methylphenol, 2-, 4- or 5-methylresorcinol, 2-, 3- or 4-methoxyphenol, 2,3-, 2,5- or 3,5-dimethoxyphenol, 2-methoxyresorcinol, 4-t-butylcatechol, 2-, 3- or 4-ethylphenol, 2,5- or 3,5-diethylphenol, 2,3,5-triethylphenol, 2-naphthol, 1,3-, 1,5- or 1,7-dihydroxynaphthalene, and polyhydroxytriphenylmethane compounds obtained by condensing xylenol with hydroxybenzaldehyde. One or more of these phenolic compounds can be used for producing the other resin. Among them, the phenolic compound is preferably o-cresol, m-cresol, p-cresol, 2,3-xylenol, 2,5-xylenol, 3,4-xylenol, 3,5-xylenol, 2,3,5-trimethylphenol, 2-t-butylphenol, 3-t-butylphenol, 4-t-butylphenol, 2-t-butyl-4-methylphenol or 2-t-butyl-5-methylphenol.

Examples of the aldehyde include aliphatic aldehydes such as formaldehyde, acetaldehyde, propionaldehyde, n-butyraldehyde, isobutyraldehyde, acrolein or croton aldehyde; alicyclic aldehydes such as cyclohexanealdehyde, cyclopentanealdehyde, furfural, and furanacrolein; aromatic aldehydes such as benzaldehyde, o-, m- or p-methylbenzaldehyde, p-ethylbenzaldehyde, 2,4-, 2,5-, 3,4- or 3,5-dimethylbenzaldehyde or o-, m- or p-hydroxybenzaldehyde; and aromatic aliphatic aldehydes such as phenylacetaldehyde or cinnamaldehyde.

One or more of these aldehydes can be used for producing the other resin. Among them, formaldehyde is preferred in view of easy industrial availability.

The catalyst for condensation of a phenolic compound and an aldehyde includes inorganic acids such as hydrochloric acid, sulfuric acid, perchloric acid or phosphoric acid; organic acid such as formic acid, acetic acid, oxalic acid, trichloroacetic acid or p-toluenesulfonic acid; divalent metal salts such as zinc acetate, zinc chloride or acetic acid magnesium.

One or more of these catalysts can be used for producing the other resin. The amount of the catalyst to be used is usually from 0.01 to 1 mole per mole of aldehyde.

The condensation of a phenolic compound and an aldehyde can be conducted in a known manner. The condensation can be conducted by mixing a phenolic compound and an aldehyde, followed by reacting them at the temperature in the range of 60° C. to 120° C. for 2 to 30 hours. The condensation can be conducted in the presence of a solvent such as methylethylketone, methylisobuthylketone and acetone. After the reaction, novolak resins can be collected by adding a solvent insoluble in water to the reaction mixture, washing the mixture with water, followed by condensing it.

Examples of the resin comprising a structural unit represented by formula (a1-2) or formula (a2-1), which is sometimes referred to as "poly(hydroxystyrene)-based resin", include poly(o-hydroxystyrene), poly(m-hydroxystyrene) and poly(p-hydroxystyrene), preferably poly(p-hydroxystyrene), which is commercially available and can be produced according to a known method.

As the vinyl ether compound, a compound having two vinyl ether structures may be used and a compound having more than three vinyl ether structures may be used. The compound having two vinyl ether structures is preferable. Herein, "the vinyl ether structure" means the following structure:

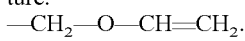

Specific examples of the vinyl ether compound include 1,4-bis(vinyloxymethyl)cyclohexane and 1,2-bis(vinyloxy)ethane, and 1,4-bis(vinyloxymethyl)cyclohexane is preferable.

As the vinyl ether compound, a commercially available one is usually used.

The content to be used of the novolak resin and the poly(hydroxystyrene)-based resin is from 30/70 to 70/30 on mass basis.

The content to be used of vinyl ether compound is preferably from 1 to 30 parts by mass, more preferably from 2 to 10 parts by mass per 100 parts by mass of the total amount of novolak resin and poly(hydroxystyrene)-based resin.

The resin obtained by reacting novolak resin, vinyl ether compound and poly(hydroxystyrene)-based resin includes those mentioned in JP2008-134515A1 and JP2008-46594A1, which can be prepared by the method described these documents. The weight average molecular weight of the resin obtained by reacting novolak resin, vinyl ether compound and poly(hydroxystyrene)-based resin is preferably 5000 or more, more preferably 10000 or more, and preferably 300000 or less, more preferably 200000 or less.

The photoresist composition of the present invention may further comprise another resin than the resin (A). Hereinafter The other resin is preferably an alkaline-soluble resin. The alkaline-soluble resin means a resin which comprises an acid group and soluble in an alkaline developer. The acid group includes a carboxy group, a sulfo group, or a phenolic-hydroxy group.

The alkaline-soluble resin includes known resins in the art such as novolak resins and vinyl resins which comprises no structural unit (a1). As the alkaline-soluble resin, a novolak resin is preferred.

Specific examples of novolak resin as the alkaline-soluble resin include those as mentioned above.

Phenol resin for producing novolak resin includes preferably o-cresol, m-cresol, p-cresol, 2,3-xylenol, 2,5-xylenol, 3,4-xylenol, 3,5-xylenol, 2,3,5-trimethylphenol, 2-t-butylphenol, 3-t-butylphenol, 4-t-butylphenol, 2-t-butyl-4-methylphenol or 2-t-butyl-5-methylphenol. The aldehyde for producing novolak resin is preferably formaldehyde.

The weight average molecular weight of novolak resin is preferably 3000 or more, more preferably 4000 or more, still more preferably 5000 or more, and preferably 50000 or less, more preferably 30000 or less, still more preferably 15000 or less.

The content of the resin in the photoresist composition of the present invention is preferably 80% by mass or more, and preferably 99% by mass or less, of the total amount of solid components.

In this specification, "solid components" means components other than solvent in the photoresist composition.

The content of resin (A) is preferably 10% to 100% by mass, more preferably 30% to 100% by mass, of the total amount of the resin.

If the photoresist composition of the present invention further comprises an alkali-soluble resin, it comprises preferably the resin (A) and novolak resin.

The content ratio of the resin (A) and novolak resin, which is represented by [the content of resin (A)]:[the content of novolak resin], is preferably from 90:10 to 30:70, more preferably from 80:20 to 40:60, still more preferably from 65:35 to 45:55, by mass ratio.

The photoresist composition of the present invention comprises an acid generator.

The acid generator is a compound which can be decomposed by light or radiation to generate an acid. The acid generators may be either ionic or non-ionic one. The acid generator can be used singly or as a mixture of two or more thereof. The non-ionic acid generator includes organic halide, sulfonate esters (e.g., 2-nitrobenzylester, aromatic sulfonate, oxime sulfonate, N-sulfonyloxyimide, sulfonyl oxyketone, diazonaphthoquinone 4-sulfonate) and sulfone (e.g., disulfone, ketosulfone, sulfonyldiazomethane). The ionic acid generator includes an onium salt comprising an onium cation (e.g., a diazonium salt, a phosphonium salt, a sulfonium salt, an iodonium salt). Anions of the onium salts include a sulfonic acid anion, a sulfonylimide anion and a sulfonylmethide anion.

The acid generator includes compounds which generate an acid upon radiation, which are described in JP63-26653A1, JP 55-164824A1, JP62-69263A1, JP63-146038A1, JP63-163452A1, JP 62-153853A1, JP63-146029A1, U.S. Pat. No. 3,779,778, U.S. Pat. No. 3,849,137, German patent No. 3914407 and European patent No. 126712.

The non-ionic acid generator is preferably a compound which comprises a group represented by formula (B1).

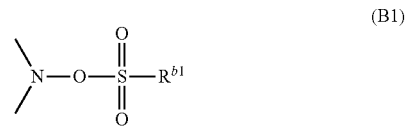

(B1)

where $R^{b1}$ represents a C1-C18 hydrocarbon group which optionally has a fluorine atom and in which a methylene group optionally has been replaced by an oxygen atom or a carbonyl group.

The hydrocarbon group represented by $R^{b1}$ includes

C1-C18 alkyl groups such as a methyl group, an ethyl group, a propyl group, an isopropyl group, a butyl group, a pentyl group, a hexyl group, a heptyl group, an octyl group, decyl group or dodecyl group, C3-C18 alicyclic hydrocarbon groups such as a monocyclic alicyclic hydrocarbon group such as a C3-C18 cycloalkyl group (e.g. a cyclopentyl group, a cyclohexyl group, methylcyclohexyl group, a dimethylcyclohexyl group, a cycloheptyl group and a cyclooctyl group) and a polycyclic alicyclic hydrocarbon group (e.g. adecahydronaphthyl group, an adamantyl group, a norbornyl group), C6-C18 aromatic hydrocarbon groups such as a phenyl group, a naphthyl group, a p-methylphenyl group, a p-tert-butylphenyl group, a p-adamantylphenyl group, a tolyl group, a xylyl group, a cumyl group, a mesityl group, a biphenyl group, a phenanthryl group, a 2,6-diethylphenyl group and a 2-methyl-6-ethylphenyl group and other groups such as aralkyl group.

The hydrocarbon group is preferably a C1-C10 alkyl group and a C6-C10 aromatic hydrocarbon group, and more preferably a C1-C8 alkyl group, and still more preferably a C1-C4 alkyl group.

The hydrocarbon group in which a methylene group has been replaced by an oxygen atom or a carbonyl group includes those represented by formulae (Y1) to (Y12), preferably those represented by formulae (Y7) to (Y9), more preferably one represented by formula (Y9).

(Y1)

(Y2)

(Y3) 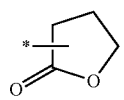

(Y4) 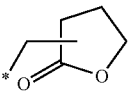

(Y5) 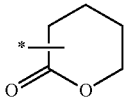

(Y6) 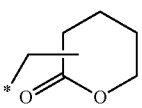

(Y7) 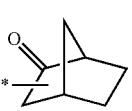

(Y8) 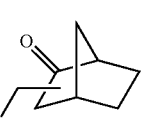

(Y9) 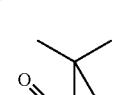

(Y10) 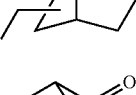

(Y11) 

(Y12) 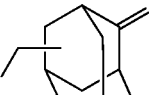

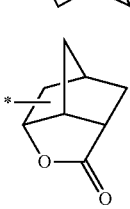

The hydrocarbon group which has a fluorine atom includes fluoroalkyl groups such as a fluoromethyl group, a fluoroethyl group, a fluoropropyl group, a fluorobutyl group, a fluoropentyl group, a fluorohexyl group, a fluoroheptyl group and a fluorooctyl group; alicyclic fluorohydrocarbon groups such as C3-C10 fluorocycloalkyl groups; aromatic fluorohydrocarbon groups such as a fluorophenyl group and fluoronaphtyl group, and a combined structure of them. The hydrocarbon group which has a fluorine atom is preferably a C1-C10 fluoroalkyl group and a C6-C10 aromatic fluorohydrocarbon group, and more preferably a C1-C8 perfluoroalkyl group, and still more preferably a C1-C4 perfluoroalkyl group.

The compound represented by formula (B1) includes those represented by formulae (b1), (b2), (b3) and (b4), preferably those represented by formulae (b1), (b2) and (b3), more preferably those represented by formulae (b1) and (b3), and still more preferably those represented by formula (b1).

(b1) 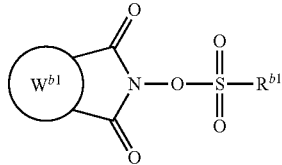

(b2) 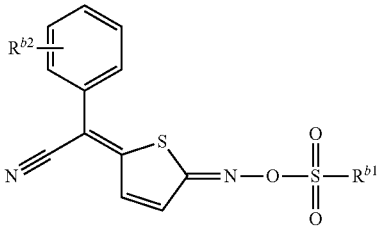

(b3) 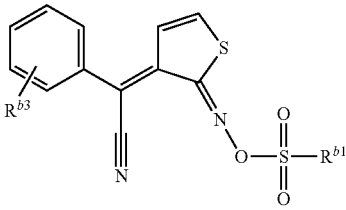

(b4) 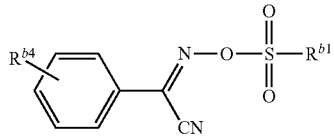

where $R^{b1}$ is as defined above, $R^{b2}$, $R^{b3}$ and $R^{b4}$ each independently represent a hydrogen atom, a C1-C5 alkyl group or a C1-C5 alkoxy group, and the ring $W^{b1}$ represents a C6-C14 aromatic hydrocarbon ring which can have a substituent and a C6-C14 aromatic heterocyclic group which optionally has a substituent.

The alkyl group represented by $R^{b2}$, $R^{b3}$ and $R^{b4}$ includes a methyl group, an ethyl group, a propyl group, a butyl group, and a pentyl group, preferably a methyl group.

The alkoxy group represented by $R^{b2}$, $R^{b3}$ and $R^{b4}$ includes a methoxy group, an ethoxy group, a propoxy group, a butoxy group, and a pentyloxy group, preferably a methoxy group.

The aromatic hydrocarbon ring represented by the ring $W^1$ includes a benzene ring, a naphthalene ring, and anthracene ring.

The aromatic heterocyclic group represented by the ring $W^{b1}$ may have a sulfur or oxygen atom, which includes the following ones:

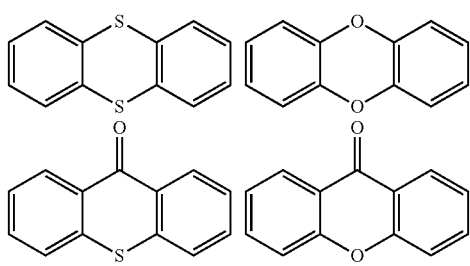

The substituent which the ring $W^{b1}$ optionally has includes a C1-C5 alkyl group.

The ring $W^{b1}$ is preferably a naphthalene ring, more preferably an unsubstituted naphthalene ring.

The compound represented by formula (b1) is preferably a compound represented by any one of formulae (b5) to (b8), more preferably the compound represented by formula (b5).

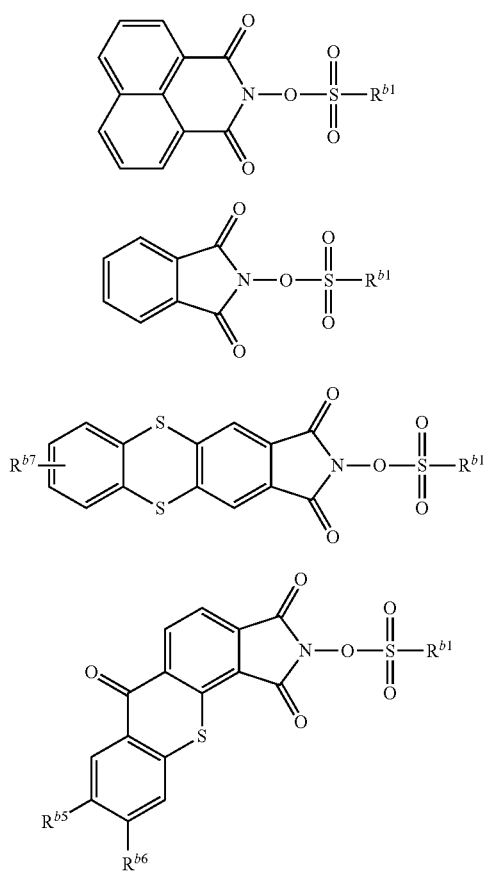

where $R^{b1}$ is as defined above, $R^{b5}$, $R^{b6}$ and $R^{b7}$ each independently represent a hydrogen atom, or a C1-C5 alkyl group.

Specific examples of the compound represented by formula (b1) include preferably a compound represented by any one of formulae (b1-1) to (b1-11), more preferably a compound represented by any one of formulae (b1-5) to (b1-11), and still more preferably a compound represented by any one of formulae (b1-6) and (b1-7).

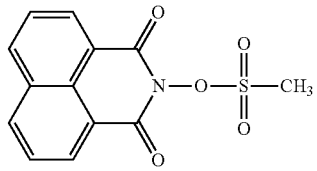
(b1-1)

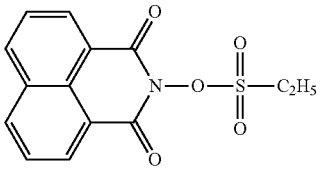
(b1-2)

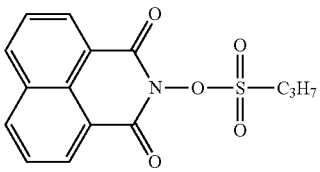
(b1-3)

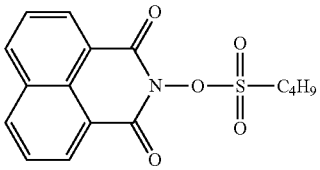
(b1-4)

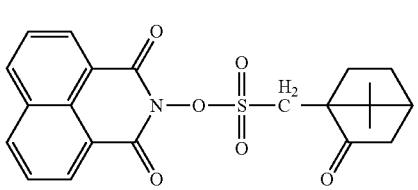
(b1-5)

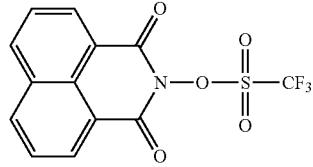
(b1-6)

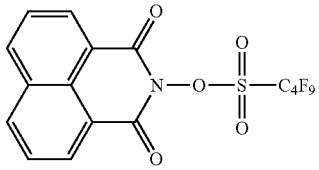
(b1-7)

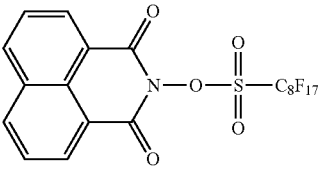
(b1-8)

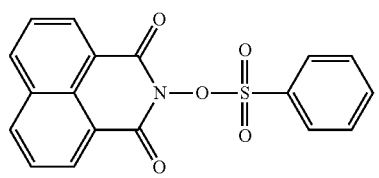
(b1-9)
(b1-10)
(b1-11)
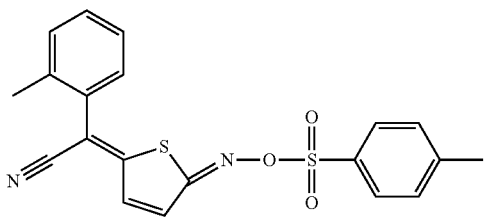
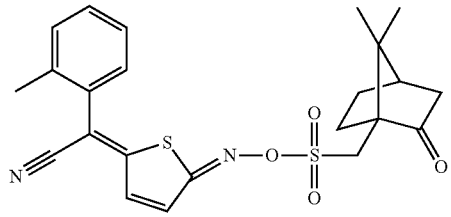
Specific examples of the compound represented by formula (b3) include the following compounds.
Specific examples of the compound represented by formula (b2) include the following compounds.
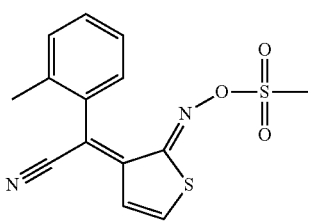
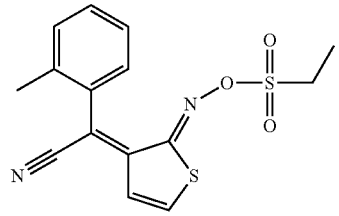
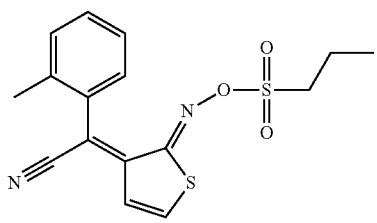
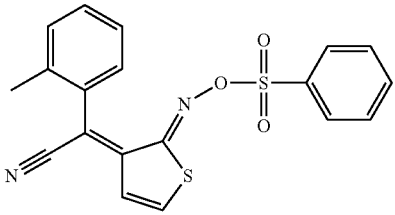
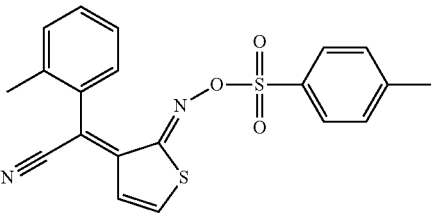

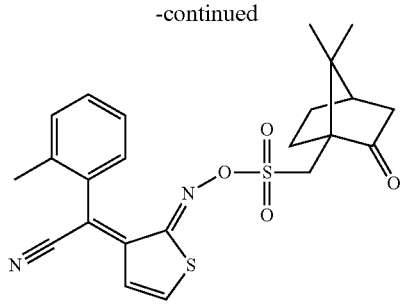

Specific examples of the compound represented by formula (b4) include the following compounds.

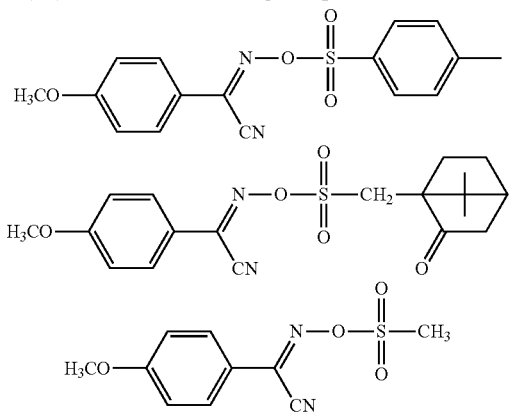

The ionic acid generator is a compound represented by formula (b9) or (b10).

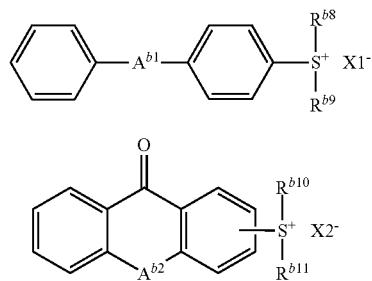

where $A^{b1}$ and $A^{b2}$ each independently represent an oxygen atom or a sulfur atom, $R^{b8}$, $R^{b9}$, $R^{b10}$ and $R^{b11}$ each independently represent a C1-C10 alkyl group or a C6-C12 aromatic hydrocarbon group, and $X1^-$ and $X2^-$ each independently represent an organic anion.

The alkyl groups represented by $R^{b8}$, $R^{b9}$, $R^{b10}$ and $R^{b11}$ include a methyl group, an ethyl group, a propyl group, a butyl group, a pentyl group, a hexyl group, a heptyl group and an octyl group.

The aromatic hydrocarbon groups represented by $R^{b8}$, $R^{b9}$, $R^{b10}$ and $R^{b11}$ include an aryl group such as phenyl group, a naphthyl group, an anthryl group, p-methylphenyl group, p-tert-buthylphenyl group, p-adamantylphenyl group, tolyl group, xylyl group, a cumenyl group, a mesityl group, a biphenyl group, a phenanthryl group, a 2,6-diethylphenyl group, and 2-methyl-6-ethylphenyl.

$R^{b8}$, $R^{b9}$, $R^{b10}$ and $R^{b11}$ are preferably a C6-C12 aromatic hydrocarbon group, more preferably a phenyl group.

Examples of $X1^-$ and $X2^-$ include sulfonic acid anion, bis(alkylsulfonyl) amide anion and tris(alkylsulfonyl) methide anion. Preferable is a sulfonic acid anion, specifically a sulfonic acid anion represented by formula (b11).

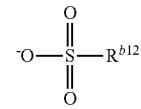

where $R^{b22}$ represents a C1-C18 hydrocarbon group which may have fluorine atoms and in which the methyl group may be substituted with an oxygen atom or a carbonyl group.

Examples of $R^{b12}$ include those of $R^{b1}$.

The compound represented by formula (b9) includes the following compounds.

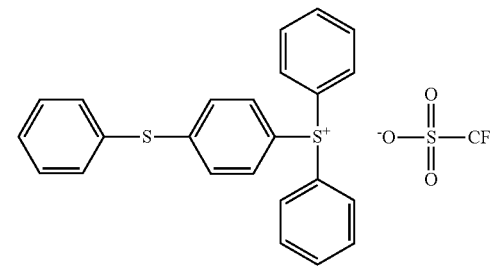

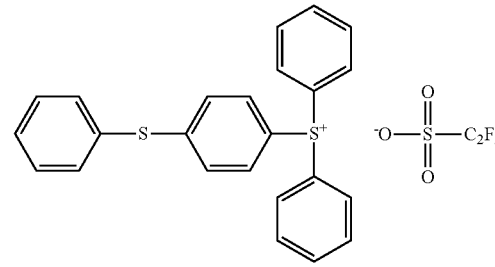

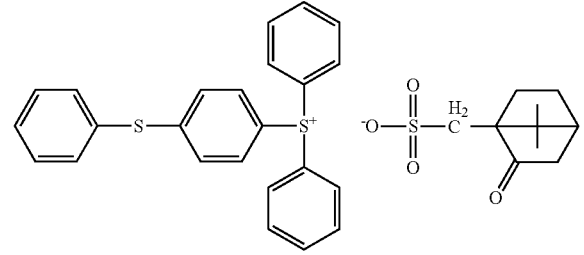

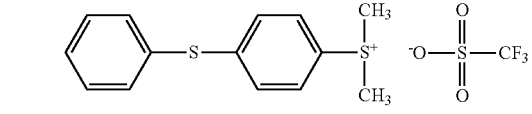

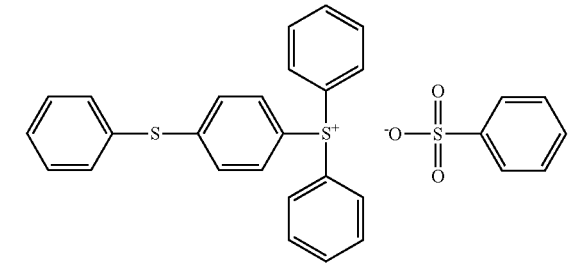

-continued

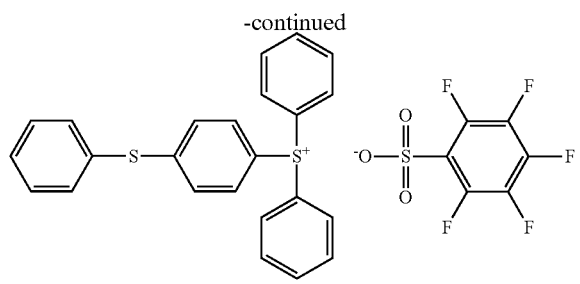

The compound represented by formula (b10) includes the following compounds.

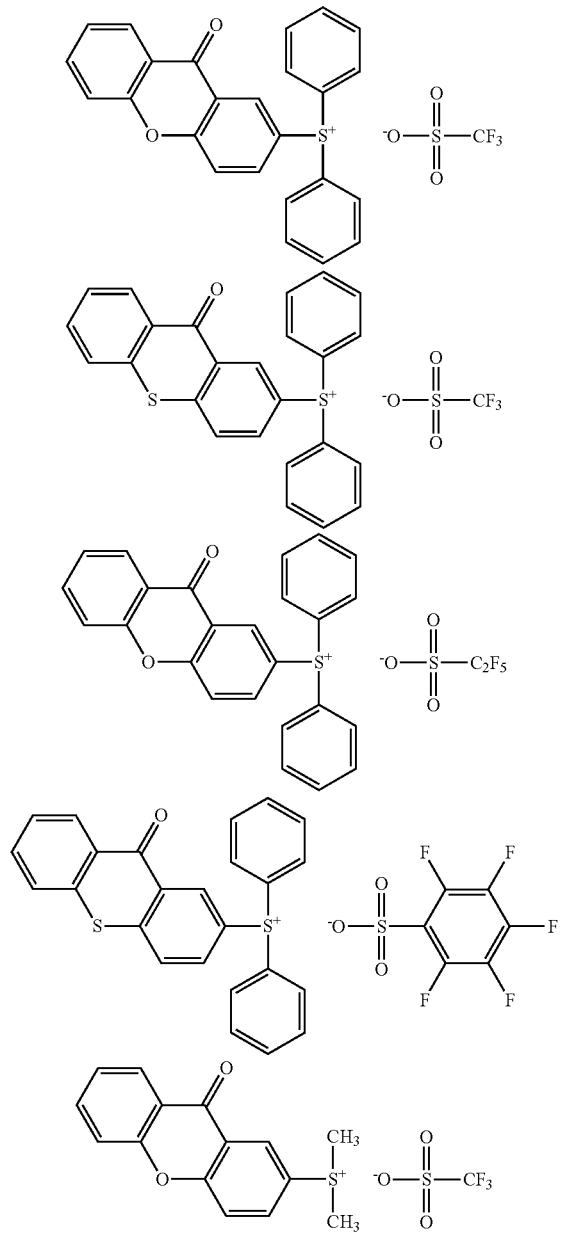

The acid generator is available on the market, or it can be prepared by a known method.

The content of the acid generator is preferably 0.5 to 30 parts by weight, more preferably 1 to 25 parts by weight, per 100 parts of the total resin.

The photoresist composition of the present invention further comprises a plasticizer.

Herein, the plasticizer means a compound providing plasticity with a polymer.

The plasticizer includes phthalates, aliphatic hydrocarbon carboxylates, aromatic polyhydric carboxylates, polyolether esters, and sulfonate ester and aromatic sulfonamides.

Phthalate includes benzyloctyl phthalate, dimethyl phthalate, dibutyl phthalate, diheptyl phthalate, bis(2-ethylhexyl) phthalate, bis(2-butoxyethyl) phthalate, diisodecyl phthalate, isononyl phthalate, butylbenzyl phthalate, ethylphthalyl ethylglycolate, butylphthalyl glycolate and are preferably ethylphthalyl ethylglycolate.

Aliphatic hydrocarbon carboxylates include dimethyl adipate, diethyl adipate, bis(2-ethylhexyl) adipate, bis(2-ethylhexyl) azelate, diisopropyl adipate, dibutyl adipate, diisobutyl adipate, dipropyl adipate, dimethyl azelate, di-n-alkyl adipate, diisononyl adipate, bis(2-butoxyethyl) adipate, dibutyl fumarate, bis(2-ethylhexyl) fumarate, dibutylmaleate, diethyl maleate, maleate bis(2-ethylhexyl), dimethyl maleate, ethyl oleate, butyl oleate, dibutyl sebacate, diethyl sebacate, bis(2-ethylhexyl) sebacate, dimethyl sebacate, di-n-octyl sebacate, diethyl succinate, isodecyl succinate, O-acetyltriethyl citrate, O-acetyltributyl citrate, O-acetylmethyl ricinoleiate, tri-butyl citrate, triethyl citrate, trimethyl citrate, and tri-propyl citrate, and preferably diisononyl adipate, bis(2-ethylhexyl) sebacate, O-acetyltributyl citrate.

The aromatic polyhydric carboxylates include trimellitate such as tris(2-ethylhexyl)trimellitate.

The polyolether esters include diethyleneglycoldibutylether, diethyleneglycoldiacetate, diethyleneglycoldibenzoate, monooleine, triacetin, tributyrin, and triethyleneglycol diacetate.

The sulfonates include phenyl pentadecanesulfonate and phenyl hexadecanesulfonate.

The aromatic sulfoneamides include N-butylbenzenesulfonamide, N-ethylbenzenesulfonamide, N-ethyl-o,p-toluenesulfonamide, N,N'-dibutylbenzenesulfonamide, and N-propylbenzenesulfonamide, and preferably N-butylbenzenesulfonamide.

The plasticizer is preferably one selected from the group consisting of phthalates, aliphatic hydrocarbon carboxylates, aromatic polyhydriccarboxylates, and aromatic sulfonamides, more preferably one selected from the group consisting of phthalates, aliphatic hydrocarbon carboxylates, and aromatic sulfonamides.

Specifically preferred are ethylphthalylethyl glycolate, N-butylbenzenesulfoneamide, O-acetyltributyl citrate, tris(2-ethylhexyl)trimellitate, diisononyl adipate, bis(2-ethylhexyl) sebacate and dihexyl phthalate, more preferred are ethylphthalylethylglycolate, tris(2-ethylhexyl)trimellitate, diisononyl adipate, bis(2-ethylhexyl) sebacate, O-acetyltributyl citricate and N-butylbenzene sulfonamide, and still more preferred are one selected from the group consisting of ethylphthalylethylglycolate, O-acetyltributyl citricate and N-butylbenzene sulfonamide.

The photoresist composition of the present invention comprises a quencher.

Herein, the quencher is a compound capable of trapping an acid generated from an acid generator by exposure. The quencher includes a basic nitrogen-containing organic compound.

The basic nitrogen-containing organic compound includes amines and ammonium salts.

The amines include primary, secondary or tertiary, aliphatic or alicyclic, amines.

Specific examples of the amines include those represented by formulae (C1) and (C2);

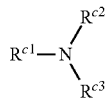
(C1)

wherein $R^{c1}$, $R^{c2}$ and $R^{c3}$ independently represent a hydrogen atom, a C1-C6 alkyl group, a C5-C10 alicyclic hydrocarbon group, or a C6-C10 aromatic hydrocarbon group, the alkyl group and the alicyclic hydrocarbon group can have a substituent selected from the group consisting of a hydroxy group, an amino group and a C1-C6 alkoxy group, and the aromatic hydrocarbon group has a substituent selected from the group consisting of a C1-C6 alkyl group, a C1-C6 alkoxy group, and a C5-C10 alicyclic hydrocarbon group.

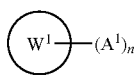
(C2)

wherein the ring $W^1$ is a nitrogen-containing heterocyclic ring, or a benzene ring having a substituted or unsubstituted amino group and the heterocyclic ring and the benzene ring can have a hydroxyl group or C1-C4 alkyl group, $A^1$ represents a phenyl group or a naphtyl group, and n represents an integer of 2 or 3.

The substituted or unsubstituted amino group is specifically represented by —$NR^1R^1$ where $R^1$ and $R^2$ each independently represent a hydrogen atom, a C1-C10 aliphatic hydrocarbon group, a C3-C10 alicyclic hydrocarbon group, a C6-C14 aromatic hydrocarbon group.

The aliphatic hydrocarbon group includes alkyl groups such as a methyl group, an ethyl group, a propyl group, butyl group, a pentyl group, a hexyl group, a heptyl group and an octyl group.

The alicyclic hydrocarbon group includes a C3-C10 cycloalkyl group such as a cyclopentyl group, a cyclohexyl group, a methylcyclohexyl group, a dimethylcyclohexyl group, a cycloheptyl group and a cyclooctyl group, and a polycyclic alicyclic hydrocarbon group such as a decahydronaphthyl group, an adamantyl group, a norbornyl group.

The aromatic hydrocarbon group includes an aryl group such as a phenyl group, a naphthyl group, a p-methylphenyl group, a p-tert-butylphenyl group, a p-adamantylphenyl group, a tolyl group, a xylyl group, a cumyl group, a mesityl group, a biphenyl group, an anthryl group, a phenanthryl group, a 2,6-diethylphenyl group and a 2-methyl-6-ethylphenyl group.

Herein, the nitrogen-containing heterocyclic ring means a heterocyclic ring which has a nitrogen atom as its ring-constituting atom.

The nitrogen-containing heterocyclic ring may be aromatic or non-aromatic, which may have another hetero atom such as an oxygen atom or sulfur atom. The heterocyclic ring has usually 1 to 3 nitrogen atoms. The heterocyclic ring represented by $W^1$ includes the rings represented by formulae (Y13) to (Y28).

(Y13)

(Y14)

(Y15)

(Y16)

(Y17)

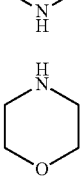
(Y18)

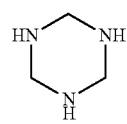
(Y19)

(Y20)

(Y21)

(Y22)

(Y23)

(Y24)

(Y25)

(Y26)

The ring $W^1$ is preferably a 5- to 6-membered aromatic heterocyclic ring, specifically a ring represented by any one of formulae (Y20) to (Y25).

Examples of the compound represented by the formula (C1) include diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, and hexamethylenediamine.

Examples of the compound represented by the formula (C2) include compounds represented by formulae (I-1) to (I-11), preferably compounds represented by formulae (I-2) to (I-8).

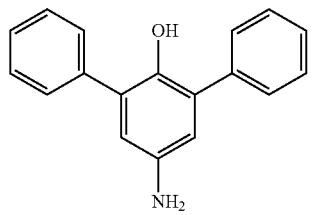

(I-11)

The compound represented by formulae (C1) and (C2) can be prepared by a known method, which is available on the market.

The content of the quencher is preferably 0.01 to 4%, more preferably 0.02 to 3% based on sum the solid components of the photoresist composition.

The photoresist composition of the present invention usually comprises a solvent. Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The amount of the solvent is generally 40% by weight or more, preferably 42% by weight or more preferably 45% by weight or more of the total amount of the photoresist composition of the present invention. The amount of the solvent is generally 75% by weight or less, preferably 70% by weight or less, and more preferably 68% by weight or less, of the total amount of the photoresist composition of the present invention.

Since the photoresist composition comprises a solvent within the above-mentioned range, it can easily form a composition film with thickness 3 µm to 150 µm. When the amount of the solvent falls within the above-mentioned range, the photoresist composition can easily provide a thick photoresist film with a flat surface.

The photoresist composition of the present invention may comprise if necessary, a small amount of various additives such as a sensitizer, a dissolution inhibitor, other polymers, a surfactant, a stabilizer and a dye as long as the effect of the present invention is not prevented.

The photoresist composition of the present invention can usually be prepared by mixing, in a solvent, an acid generator, the resin (A), a plasticizer, and if necessary a quencher or other additives, at a suitable ratio for the composition, optionally followed by filtrating the mixture with a filter having from 0.1 µm to 50 µm of a pore size.

The order of mixing these components is not limited to any specific order. The temperature at mixing the components is usually 10 to 40° C., which can be selected depending on the resin or the like. The mixing time is usually 0.5 to 24 hours, which can be selected in view of the temperature. The means for mixing the components is not limited to specific ones, which includes a stirrer.

The amounts of the components in the photoresist compositions can be adjusted by selecting the amount to be used for production of them.

The method of the present invention comprises the following steps (1) to (4):

(1) a step of applying the photoresist composition of the present invention on a substrate, (2) a step of forming a photoresist composition film by drying the composition, (3) a step of exposing the film to radiation, and (4) a step of developing the exposed film to form a photoresist pattern.

The applying of the composition on a substrate is usually conducted using a conventional apparatus such as spin coater.

The substrate includes silicon wafers on which semiconductor elements (e.g., a transistor, a diode) may be formed in advance.

If the photoresist composition is to be used for bump formation, a substrate on which a conductive material has been laminated is preferred. Such conductive material includes gold (Au) copper (Cu), nickel (Ni), tin (Sn), palladium (Pd) and silver (Ag), or alloys comprising a metal selected from the group. Preferred is copper or an alloy comprising copper.

The substrate may be washed or coated with a reflect-preventing layer such as one containing hexamethyldisilazane.

For forming the reflect-preventing layer, such composition for organic reflect-preventing layer as available on the market can be used.

The photoresist composition film is usually formed by drying the applied composition with a heating apparatus such as hot plate or a decompressor, to thereby dry off the solvent. The heating temperature is preferably 50 to 200° C., and the operation pressure is preferably 1 to $1.0*10^5$ Pa.

The thickness of the film obtained by step (2) is in the range of preferably 3 µm to 150 µm, more preferably 4 µm to 100 µm.

The film is exposed to radiation using an exposure system. The exposure is usually conducted through a mask having a pattern corresponding to a desired photoresist pattern. The exposure source includes known one, preferably g ray (wavelength: 436 nm), h ray (wavelength: 405 nm) and i ray (wavelength: 365 nm).

The process may further comprise baking the exposed film, so called post-exposure bake, after step (3).

The step of baking the exposed film is conducted with heating means such as hot plates. The deprotection reaction further proceeds by post-exposure bake.

The temperature of baking the exposed film is preferably 50 to 200° C., and more preferably 60 to 120° C. The time of baking is usually 40 to 400 seconds, preferably 50 to 350 seconds.

The development of the exposed or baked photoresist composition film is usually carried out with an alkaline developer using a development apparatus.

The alkaline developer to be used may be any one of various alkaline aqueous solution to be used in the art. Generally, an aqueous solution of tetramethylammonium hydroxide or (2-hydroxyethyl)trimethylammonium hydroxide (commonly known as "choline") is often used.

After development, the formed photoresist pattern is preferably washed with ultrapure water, and the remained water on the photoresist pattern and the substrate is preferably removed.

The photoresist composition of the present invention can provide thick photoresist films which can have fine photoresist pattern, therefore the composition is suitable for producing bumps.

A photoresist composition for producing a photoresist film with thickness 3 µm to 150 µm, which comprises the abovementioned resin, an acid generator, a plasticizer, and a solvent is one aspect of the present invention.

The photoresist composition of the present invention is useful as a material for producing bumps.

Bumps can be produced by the process comprising the following steps;

laminating a conductive material (e.g. seed metal) on a wafer which may have semiconductor elements thereon to thereby form a conductive film, producing a photoresist pattern on the conductive film by the method of the present invention, pattern plating an electrode material such as Cu, Ni or solder, using the photoresist pattern as its mold, and removing the photoresist film and the conductive film from the device by etching or the like, optionally followed by removing the electrode material by heat-melting the electrode material.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted.

The weight-average molecular weight of any material used in the following examples is a value determined by gel permeation chromatography under the following conditions.

Equipment: HLC-8120GPC type, manufactured by TOSOH CORPORATION

Column: Three of TSKgel Multipore HXL-M with guard column, manufactured by TOSOH CORPORATION Solvent: tetrahydrofuran Flow rate: 1.0 mL/min.

Detector: RI Detector

Column temperature: 40° C.

Injection volume: 100 μL

Standard reference material: standard polystyrene, manufactured by TOSOH CORPORATION

Synthesis Example 1

Twenty (20) parts of polyvinylphenol (Trade name VP-15000, Product of Nippon Soda Co., Ltd.) was dissolved in 240 parts of methylisobutylketone, followed by concentrating it with an evaporator.

To a four-necked flask with a stirring device, a reflux condenser and a thermometer, the concentrated mixture and 0.003 parts of p-toluenesulfonic acid dehydrates were poured and then 5.05 parts of ethylvinylether was dropped thereinto at a temperature of 20 to 25° C. over 10 minutes. The obtained mixture was stirred at the above-mentioned temperature for 2 hours and then diluted with 200 parts of methylisobutylketone, followed by washing it with ion-exchanged water five times. The washed mixture was concentrated until its amount became 45 parts using an evaporator, and 150 parts of propyleneglycolmonomethylether acetate were added thereto, followed by concentrating it again to obtain 78 parts of propyleneglycolmonomethylether acetate solution (solid content: 29%) of resin A1-1, the weight average molecular weight of which was 22100, and in which the content of the unit derived from ethoxyethyl group was 38.5%. Resin A1-1 comprises the following structural units.

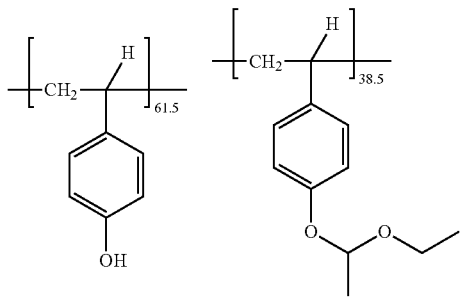

Synthesis Example 2

To a four-necked flask with a stirring device, a reflux condenser and a thermometer, 537 parts of 2,5-xylenol, 107.5 parts of salicylaldehyde, 20.9 parts of p-toluenesulfonic acid and 860 parts of methanol were poured, and heated to make the mixture refluxed and then the temperature of the mixture was kept for 4 hours. Then the obtained mixture was cooled, and 1440 parts of methylisobutylketone was fed thereto, followed by removing 1120 parts of the mixture therefrom with distilling.

Then 476 parts of m-cresol was added to the residues and heated to 65° C., followed by dropping 571 parts of 37% formalin thereto over 1.5 hours while controlling the temperature of the mixture to be 87° C. at the end of dropping. Then the temperature of the mixture was kept at 87° C. for 10 hours, and then 884 parts of methylisobutylketone was added to the obtained resin solution, followed by washing it with water three times. To the washed resin solution, 3514 parts of methylisobutylketone and 4647 parts of n-heptane were added and heated to 60° C., and then stirred for 1 hour, followed by separating therefrom the resin solution of the bottom layer. To the separated resin solution, 3500 parts of propyleneglycolmonomethylether acetate was added to dilute it, followed by concentrating it to give 1520 parts of methylisobutylketone solution (solid content: 30%) of resin A2-2, the weight average molecular weight of which was 7000.

Synthesis Example 3

Three hundred (300 parts) of poly(p-hydroxystyrene) [Trade name, MARUKA LYNCUR S2P, made of Maruzen Petrochemical, Co., Ltd.] was dispersed in 1200 parts of ion-exchanged water, and then 980 parts of novolak resin A2-2 and 1330 parts of methylisobutylketone were added thereto, followed by removing its aqueous layer therefrom. After concentrating the residue until the total amount became 1600 parts, 750 parts of methylisobutylketone was added thereto and then concentrated until the total amount became 1620 parts. To a four-necked flask with a stirring device, a reflux condenser and a thermometer, added were the concentrated resin mixture, 1400 parts of propyleneglycolmonomethylether acetate, 980 parts of methylisobutylketone and 0.09 parts of p-toluenesulfonic acid, then 83 parts of 1,4-cyclohexanedimethanoldivinylether, the compound represented by formula (z), was dropped thereinto at a room temperature over 5 minutes.

The obtained mixture was stirred at the room temperature for 5 hours, and 0.16 parts of triethylamine was added thereto, followed by washing it with 1000 parts of ion-exchanged water five times. The obtained resin solution was concentrated until the total amount became 1200 parts, and 2170 parts of propyleneglycolmonomethylether acetate were added thereto, followed by concentrating it until its amount became 2000 parts to give a solution (solid content: 23%) of resin A1-2, the weight average molecular weight of which was 92200.

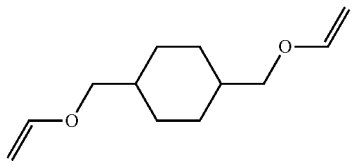
(z)

Synthesis Example 4

To a four-necked flask with a stirring device, a reflux condenser and a thermometer, 413.5 parts of 2,5-xylenol, 103.4 parts of salicylaldehyde, 20.1 parts of p-toluenesulfonic acid and 826.9 parts of methanol were poured, and heated to make the mixture refluxed and then the temperature of the mixture was kept for 4 hours. Then the obtained mixture was cooled, and 1320 parts of methylisobutylketone was fed thereto, followed by removing 1075 parts of the mixture therefrom with distilling.

Then 762.7 parts of m-cresol and 29 parts of 2-tert-butyl-5-methylphenol were added to the residues and heated to 65° C., followed by dropping 678 parts of 37% formalin thereto over 1.5 hours while controlling the temperature of the mixture to be 87° C. at the end of dropping. Then the temperature of the mixture was kept at 87° C. for 10 hours, and then 1115 parts of methylisobutylketone was added to the obtained resin solution, followed by washing it with water three times. To the washed resin solution, 500 parts of methylisobutylketone was added, followed by distilling it under reduced pressure until the amount of solution became 3435 parts. To the washed resin solution, 3796 parts of methylisobutylketone and 4990 parts of n-heptane were added and heated to 60° C., and then stirred for 1 hour, followed by separating therefrom the resin solution of the bottom layer. To the separated resin solution, 3500 parts of propyleneglycolmonomethylether acetate was added to dilute it, followed by concentrating it to give 1690 parts of propyleneglycolmonomethylether acetate solution (solid content: 43%) of Resin A2-1 the weight average molecular weight of which was 7000.

Examples 1 to 12 and Comparative Example 1

The following components were mixed and dissolved in the solvent as shown in Table 1, and further filtrated through a fluorine resin filter having pore diameter of 5 μm to prepare photoresist compositions. The contents of the components in each example are shown in Table 1.

The symbols recited in Table 1 represent the following components.
<Resin>
A1-1: Resin A1-1
A1-2: Resin A1-2
A2-1: Resin A2-1
<Acid Generator>
B1: N-hydroxynaphtylimidetriflate, represented by formula, trade name "NAI-105", product by Midori Kagaku, Co., Ltd.

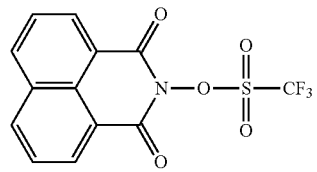 [SMILES: O=C1c2cccc3cccc(c23)C(=O)N1OS(=O)(=O)C(F)(F)F]

B2: The compound represented by formula, trade name "IRGACURE PAG-103", product by BASF Japan, Co., Ltd.

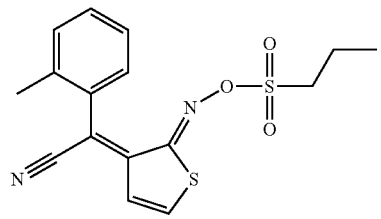 [SMILES: CCCS(=O)(=O)O/N=C1\SC=C\C1=C(/C#N)c1ccccc1C]

<Quencher>
C1: 2,4,5-triphenylimidazole (Product of Tokyo Chemical Industry, Co., Ltd.)
C2: N,N-dicyclohexylmethylamine (Product of Aldrich Corporation)
<Plasticizer>
E1: ethylphthalylethyl glycolate (Product of Tokyo Chemical Industry, Co., Ltd.)

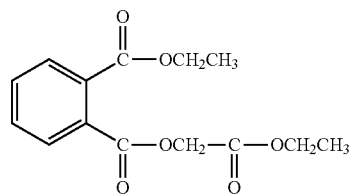

E2: N-butylbenzenesulfoneamide (Product of Tokyo Chemical Industry, Co., Ltd.)

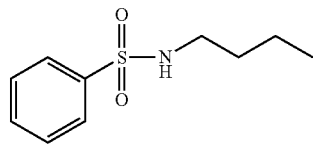

E3: O-acetyltributyl citrate (Product of Tokyo Chemical Industry, Co., Ltd.)

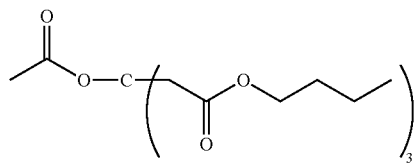

E4: Tris(2-ethylhexyl)trimellitate (Product of Tokyo Chemical Industry, Co., Ltd.)

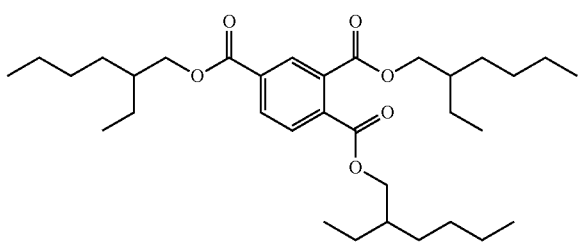 [SMILES: CCCCC(CC)COC(=O)c1ccc(C(=O)OCC(CC)CCCC)c(C(=O)OCC(CC)CCCC)c1]

E5: Diisononyl adipate (Product of Tokyo Chemical Industry, Co., Ltd.)

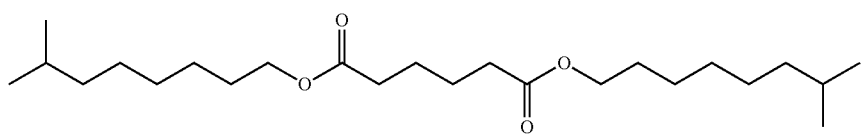 [SMILES: CC(C)CCCCCCOC(=O)CCCCC(=O)OCCCCCCC(C)C]

E6: Bis(2-ethylhexyl) sebacate (Product of Tokyo Chemical Industry, Co., Ltd.)

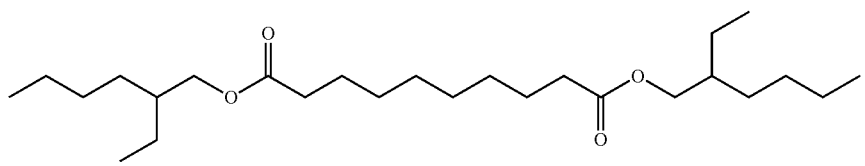 [SMILES: CCCCC(CC)COC(=O)CCCCCCCCC(=O)OCC(CC)CCCC]

E7: Dihexyl phthalate (Product of Tokyo Chemical Industry, Co., Ltd.)

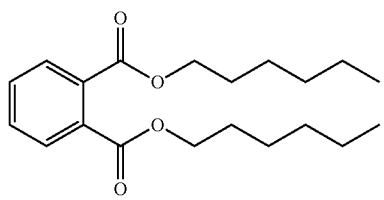 [SMILES: CCCCCCOC(=O)c1ccccc1C(=O)OCCCCCC]

<Solvent>
D1: Propyleneglycolmonomethylether acetate
<Surfactant>
S1: Polyether denaturated silicone oil (Toray silicone SH8400; Product of Toray Dow Corning, Co., Ltd.)

TABLE 1

| Ex. No. | Resin (Kind/parts) | Acid generator (Kind/parts) | Quencher (Kind/parts) | Plasticizer (Kind/parts) | Surfactant (Kind/parts) | Solvent (Kind/parts) |
|---|---|---|---|---|---|---|
| Ex. 1 | A1-1/7.425 A2-1/6.075 | B1/0.3 | C1/0.06 | E1/1.35 | S1/0.0017 | D1/20 |
| Ex. 2 | A1-1/7.425 A2-1/6.075 | B1/0.3 | C2/0.05 | E1/1.35 | S1/0.0017 | D1/20 |
| Ex. 3 | A1-1/7.425 A2-1/6.075 | B1/0.3 | C2/0.05 | E2/1.35 | S1/0.0017 | D1/20 |
| Ex. 4 | A1-1/7.425 A2-1/6.075 | B1/0.3 | C2/0.05 | E3/1.35 | S1/0.0017 | D1/20 |
| Ex. 5 | A1-1/7.425 A2-1/6.075 | B1/0.3 | C2/0.05 | E1/2.7 | S1/0.0017 | D1/20 |
| Ex. 6 | A1-1/7.425 A2-1/6.075 | B1/0.3 | C2/0.05 | E2/2.7 | S1/0.0017 | D1/20 |
| Ex. 7 | A1-1/7.425 A2-1/6.075 | B1/0.3 | C2/0.05 | E3/2.7 | S1/0.0017 | D1/20 |
| Ex. 8 | A1-2/13.5 | B1/0.3 | C1/0.06 | E1/1.35 | S1/0.0017 | D1/20 |
| Ex. 9 | A1-1/7.425 A2-1/6.075 | B1/0.3 | C2/0.05 | E4/1.35 | S1/0.0017 | D1/20 |
| Ex. 10 | A1-1/7.425 A2-1/6.075 | B1/0.3 | C2/0.05 | E5/1.35 | S1/0.0017 | D1/20 |
| Ex. 11 | A1-1/7.425 A2-1/6.075 | B1/0.3 | C2/0.05 | E6/1.35 | S1/0.0017 | D1/20 |
| Ex. 12 | A1-2/13.5 | B1/0.3 | C2/0.03 | E7/0.78 | S1/0.0017 | D1/20 |
| Comp. Ex. 1 | A1-1/7.425 A2-1/6.075 | B1/0.3 | C2/0.05 | None | S1/0.0017 | D1/20 |

(Preparation of Photoresist Pattern)

Over the substrate (4 inches) where copper had been vapor-deposited on a silicon wafer, each of the photoresist compositions prepared as above was spin-coated so that the thickness of the resulting film became 20 μm after drying. The cupper substrates thus coated with the respective photoresist compositions were each prebaked on a direct hotplate at 90° C. for 180 seconds.

Using an i-ray stepper ("NSR 1755i7A" manufactured by Nikon, NA=0.5), each wafer thus formed with the respective film was subjected to 1:1 line and space pattern exposure with the exposure quantity being varied stepwise. The exposure was conducted with a mask having line and space pattern.

After the exposure, each wafer was subjected to paddle development for 60 seconds with an aqueous solution of 2.38 wt % tetramethylammonium hydroxide three times.

(Evaluation)

In this evaluation, the ES (Effective Sensitivity) means the exposure quantity that the line and space pattern with the line width 20 μm became a pattern with (line width):(space width) being 1:1 after exposure through the mask having line and space pattern with the line width 20 μm.

I. Cracks

The photoresist patterns were obtained by the process where the exposure was conducted at the exposure quantity of ES, and then each pattern was observed with a scanning electron microscope. Each substrate with the obtained photoresist pattern was left in sequence in thermostatic oven at 25° C. for two hours, in thermostatic oven at 40° C. for two hours, in thermostatic oven at −5° C. for two hours, in thermostatic oven at 40° C. for two hours, and then in thermostatic oven at 23° C. for 24 hours. Then the surface of each photoresist pattern was observed during leaving it at 23° C. The surface where no cracks were observed after leaving it 23° C. was marked by "○" (good). The surface where cracks were observed 3 hours after starting to leave it at 23° C. was marked by "X" (bad).

II. Shape

The photoresist patterns were obtained by the process where the exposure was conducted at the exposure quantity of ES, and then each pattern was observed with a scanning electron microscope.

When the profile of pattern was rectangle at both top and bottom sites as shown in FIG. 1(a), it was marked by "○○" (very good).

When the profile of pattern was a round shape at its top site as shown in FIG. 1(b), it was marked by "○" (good). When the profile of pattern was a shape whose profile looked like the letter "T" as shown in FIG. 1(c), it was marked by "X" (bad).

III. Resolution

Each of patterns obtained by the process where the exposure was conducted at the exposure quantity of ES was observed with a scanning electron microscope. The minimum value of the dissolved line width was determined as its resolution value. The results of the evaluation are listed in Table 2.

In columns showing the results of profiles, the numbers in their brackets represent the value of resolution (μm). In the columns showing the results of shapes, the symbols (a) to (c) represent the symbols of the figures corresponding to each shape.

TABLE 2

|        | Cracks | Shape   | Resolution (μm) |
|--------|--------|---------|-----------------|
| Ex. 1  | ○      | ○○ (a)  | 10              |
| Ex. 2  | ○      | ○○ (a)  | 10              |
| Ex. 3  | ○      | ○○ (a)  | 10              |
| Ex. 4  | ○      | ○○ (a)  | 10              |
| Ex. 5  | ○      | ○○ (a)  | 10              |
| Ex. 6  | ○      | ○○ (a)  | 10              |
| Ex. 7  | ○      | ○○ (a)  | 10              |
| Ex. 8  | ○      | ○○ (a)  | 10              |
| Ex. 9  | ○      | ○○ (a)  | 10              |
| Ex. 10 | ○      | ○○ (a)  | 10              |
| Ex. 11 | ○      | ○○ (a)  | 10              |
| Ex. 12 | ○      | ○ (b)   | 10              |
| Comp. Ex. 1 | X | —       | —               |

Examples 13 to 15

The components as shown in Table 3 were mixed and dissolved in the solvent as shown in Table 3, and further filtrated through a fluorine resin filter having pore diameter of 0.5 μm to prepare photoresist compositions.

TABLE 3

| Ex. No. | Resin (Kind/parts) | Acid generator (Kind/parts) | Quencher (Kind/parts) | Plasticizer (Kind/parts) | Surfactant (Kind/parts) | Solvent (Kind/parts) |
|---------|--------------------|-----------------------------|------------------------|---------------------------|--------------------------|----------------------|
| Ex. 13  | A1-1/7.425 A2-1/6.075 | B1/0.3 | C1/0.06 | E1/1.35 | S1/0.0019 | D1/26 |
| Ex. 14  | A1-1/7.425 A2-1/6.075 | B2/0.3 | C2/0.05 | E1/1.35 | S1/0.0019 | D1/26 |
| Ex. 15  | A1-2/13.5 | B1/0.3 | C1/0.06 | E1/1.35 | S1/0.0019 | D1/26 |

The photoresist patterns were made in the same manner as Examples 1 to 12 except that the film thickness after prebake was 5 μm instead of 20 μm.

The obtained patterns were evaluated as follow.

In this evaluation, the ES (Effective Sensitivity) means the exposure quantity that the line and space pattern with the line width 3 μm became a pattern with (line width): (space width) being 1:1 after exposure through the mask having line and space pattern with the line width 3 μm.

I. Cracks

The occurrence of cracks was evaluated in the same manner as mentioned above.

II. Shape

The photoresist patterns having 3 μm of line width were obtained by the process where the exposure was conducted at the exposure quantity of the above-mentioned ES, and then each pattern was observed with a scanning electron microscope. When the profile of pattern was rectangle at both top and bottom sites as shown in FIG. 1(a), it was marked by "○" (very good).

When the profile of pattern was a round shape at its top site as shown in FIG. 1(b) or when the profile of pattern was a shape whose profile looked like the letter "T" as shown in FIG. 1(c), it was marked by "X" (bad).

III. Resolution

Each of patterns obtained by the process where the exposure was conducted at the exposure quantity of ES was observed with a scanning electron microscope. The minimum value of the dissolved line width was determined as its resolution value. The results of the evaluation are listed in Table 4.

In the columns showing the results of shapes, the symbols (a) to (c) represent the symbols of the figures corresponding to each shape.

TABLE 4

|        | Cracks | Shape | Resolution (μm) |
|--------|--------|-------|-----------------|
| Ex. 13 | ○      | ○ (a) | 2               |
| Ex. 14 | ○      | ○ (a) | 2               |
| Ex. 15 | ○      | ○ (a) | 2               |

Examples 16 and 17

The components as shown in Table 5 were mixed and dissolved in the solvent as shown in Table 5, and further filtrated through a fluorine resin filter having hole diameter of 15 μm to prepare photoresist compositions.

TABLE 5

| Ex. No. | Resin (Kind/parts) | Acid generator (Kind/parts) | Quencher (Kind/parts) | Plasticizer (Kind/parts) | Surfactant (Kind/parts) | Solvent (Kind/parts) |
|---|---|---|---|---|---|---|
| Ex. 16 | A1-1/7.425 A2-1/6.075 | B1/0.15 | C1/0.03 | E1/1.35 | S1/0.0014 | D1/14 |
| Ex. 17 | A1-2/13.5 | B1/0.15 | C1/0.03 | E1/1.35 | S1/0.0014 | D1/14 |

Over the substrate (4 inches) where copper had been vapor-deposited on a silicon wafer, each of the photoresist compositions prepared as above was spin-coated so that the thickness of the resulting film became 50 μm after drying. The substrates thus coated with the respective photoresist compositions were each prebaked on a direct hotplate at the 90° C. for 300 seconds.

Using an i-ray stepper ("NSR 1755i7A" manufactured by Nikon, NA=0.5), each wafer thus formed with the respective resist film was subjected to contact hole pattern exposure using a photomask for forming a contact hole pattern having a hole pitch of 100 μm and a hole diameter of 50 μm with the exposure quantity being varied stepwise.

After the exposure, each wafer was subjected to paddle development for 60 seconds with an aqueous solution of 2.38 wt tetramethylammonium hydroxide three times.

(Evaluation)

The obtained patterns were evaluated as follow.

In this evaluation, the ES (Effective Sensitivity) means the exposure quantity that the contact hole pattern became a pattern with the hole diameter 50 μm after exposure through the mask.

I. Cracks

The occurrence of cracks was evaluated in the same manner as mentioned above.

II. Shape

The photoresist patterns were obtained by the process where the exposure was conducted at the exposure quantity of ES using the photomask for forming a contact hole pattern, and then each pattern was observed with a scanning electron microscope. In this evaluation, the ES (Effective Sensitivity) means the exposure quantity which can obtain a contact hole pattern having a hole diameter of 50 μm.

Figure 2:
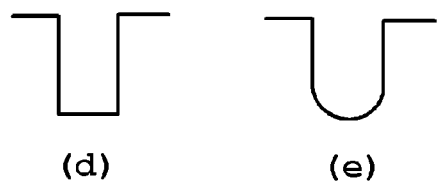
FIGS. 2(d) and 2(e) illustrate a schematic cross-sectional view of photoresist film having contact hole pattern, prepared in Examples 16 to 17.

When the profile of pattern was rectangle at both top and bottom sites as shown in FIG. 2(d), it was marked by "○" (good). When the profile of pattern was a round shape at its bottom site as shown in FIG. 2(e), it was marked by "X" (bad).

III. Resolution

Each of patterns obtained by the process where the exposure was conducted at the exposure quantity of ES was observed with a scanning electron microscope. The minimum value of dissolved hole diameters was determined as resolution value.

The results of the evaluation are listed in Table 6.

In the columns showing the results of shapes, the symbols (d) and (e) represent the symbols of the figures corresponding to each shape.

TABLE 6

|  | Cracks | Shape | Resolution (μm) |
|---|---|---|---|
| Ex. 16 | ○ | ○ (d) | 20 |
| Ex. 17 | ○ | ○ (d) | 20 |

The photoresist composition of the present invention can provide a photoresist film showing excellent resistance to heat and hardly cracking. Furthermore, the photoresist film obtained from the photoresist composition can be thick and provide photoresist pattern with excellent shape and resolution.

What is claimed is:

1. A photoresist composition comprising:
   a resin which shows an increase in solubility in an aqueous alkali solution by an action of an acid;
   an acid generator;
   a plasticizer selected from the group consisting of ethylphthalylethylglycolate, tris(2-ethylhexyl) trimellitate and N-butylbenzene sulfonamide; and
   a solvent the amount of which is from 40 to 75% by mass of the total amount of the photoresist composition,
   said resin being a resin obtained by reacting a novolak resin, a compound having two or more vinyloxy groups and a resin comprising a structural unit represented by formula (a1-2), a structural unit represented by formula (a2-1), or both of the structural units:

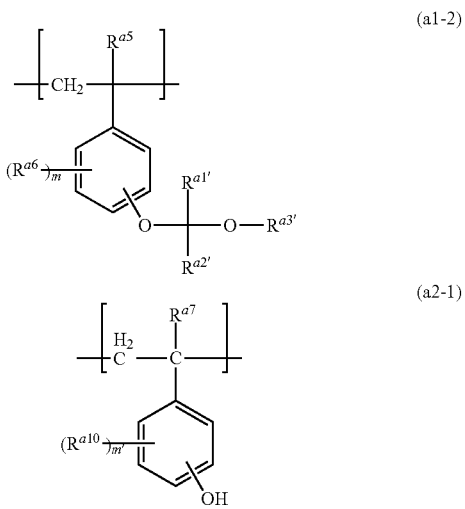

wherein $R^{a1'}$ and $R^{a2'}$ each independently represent a hydrogen atom or a C1-C12 hydrocarbon group where a methylene group has optionally been replaced by an oxygen atom or a sulfur atom, $R^{a3'}$ represent a C1-C20 hydrocarbon group where a methylene group has optionally been replaced by an oxygen atom or a sulfur atom, or one of $R^{a1'}$ and $R^{a2'}$ is bonded to $R^{a3'}$ to form a C2-C20 divalent hydrocarbon group where a methylene group has optionally been replaced by an oxygen atom or a sulfur atom, and the other represents a hydrogen atom or a C1-C12 hydrocarbon group where a methylene group has optionally been replaced by an oxygen atom or a sulfur atom, $R^{a5}$ represents a hydrogen atom or a methyl group, $R^{a6}$ represents a C1-C6 alkyl group or a C1-C6 alkoxy group, and m represents an integer of 0 to 4, $R^{a7}$ represents a hydrogen atom or a methyl group, and $R^{a10}$ represents a C1-C6 alkyl group or a C1-C6 alkoxy group, and m' represents an integer of 0 to 4.

2. The photoresist composition according to claim 1, which further comprises a novolak resin.

3. The photoresist composition according to claim 1, wherein the acid generator is a compound represented by formula (b5):

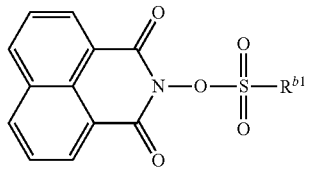

(b5)

where $R^{b1}$ represents a C1-C18 hydrocarbon group in which a hydrogen atom has optionally been replaced by a fluorine atom and in which a methylene group has optionally been replaced by an oxygen atom or a carbonyl group.

4. A method for producing a photoresist film with thickness 3 μm to 150 μm, which comprises applying the photoresist composition according to claim 1 to a substrate.

5. A photoresist film with thickness 3 μm to 150 μm, which is obtained by applying the photoresist composition according to claim 1 to a substrate.

6. A process for producing a photoresist pattern comprising:
(1) a step of applying the photoresist composition according to claim 1 on a substrate,
(2) a step of forming a photoresist composition film by drying the photoresist composition,
(3) a step of exposing the photoresist composition film through a mask which has a pattern corresponding to the photoresist pattern, and
(4) a step of developing the exposed photoresist composition film with an alkaline developer.

* * * * *